United States Patent
Madala et al.

(10) Patent No.: US 9,515,605 B1
(45) Date of Patent: Dec. 6, 2016

(54) VARIABLE GAIN ELECTRO-MECHANICAL OSCILLATOR AND METHOD FOR STARTING BALANCED OSCILLATIONS

(71) Applicant: Maxlinear Asia Singapore PTE LTD, Singapore (SG)

(72) Inventors: Srinivasa Rao Madala, Chimakurthy (IN); Kumar Baratj Singareddy, Bangalore (IN); Hormoz Djahanshahi, Port Moody (CA); Stanley Ho, Richmond (CA)

(73) Assignee: Microsemi Storage Solutions (U.S.), Inc., Aliso Veijo, CA (US)

( * ) Notice: Subject to any disclaimer, the term of this patent is extended or adjusted under 35 U.S.C. 154(b) by 0 days.

(21) Appl. No.: 14/835,244

(22) Filed: Aug. 25, 2015

(51) Int. Cl.
*H03B 5/12* (2006.01)
*H03B 5/30* (2006.01)

(52) U.S. Cl.
CPC .......... *H03B 5/1212* (2013.01); *H03B 5/1237* (2013.01); *H03B 5/30* (2013.01)

(58) Field of Classification Search
CPC .......... H03B 5/364; H03B 5/30; H03B 5/06; H03B 2200/0094; H03B 2200/0034
USPC ................. 331/116 R, 116 FE, 158
See application file for complete search history.

(56) References Cited

U.S. PATENT DOCUMENTS

| | | |
|---|---|---|
| 6,696,899 B2 | 2/2004 | Ruffieux |
| 6,828,844 B2 | 12/2004 | Suzuki et al. |
| 6,956,443 B2 | 10/2005 | Ruffieux |
| 7,019,598 B2 | 3/2006 | Duncan et al. |
| 7,123,109 B2 | 10/2006 | Stevenson et al. |
| 7,170,357 B1 | 1/2007 | Driscoll et al. |
| 7,312,672 B2 | 12/2007 | Yamamoto |

(Continued)

FOREIGN PATENT DOCUMENTS

EP     1732213 A1    12/2006

OTHER PUBLICATIONS

Hu et al., "A 50ppm 600MHz Frequency Reference Utilizing the Series Resonance of an FBAR" IEEE Radio Frequency Integrated Circuits Symposium, 2010, pp. 325-328.
Ruffieux, "A High-Stability, Ultra-Low-Power Differential Oscillator Circuit for Demanding Radio Applications", Proc. of European Solid-States Circuit Conference, 2002, pp. 85-88.

(Continued)

*Primary Examiner* — Jeffrey Shin
(74) *Attorney, Agent, or Firm* — Dennis R. Haszko

(57) ABSTRACT

A cross-coupled complementary balanced electro-mechanical oscillator and a method for generating balanced oscillations. The oscillator comprises an electro-mechanical resonator connected to an oscillator core. The oscillator core comprises capacitively cross-coupled complementary programmable inverters and a resistor network. The capacitors inhibit the inverters from latching to a non-oscillatory direct-current (DC) state. The resistor network forms a high pass filter with the capacitors to inhibit relaxation oscillations. The inverters are programmable such that their gain can be varied over time to avoid parasitic oscillations. The oscillator may be frequency-tunable. The method comprises starting balanced oscillations in the oscillator with a low gain to inhibit high-frequency parasitic oscillation modes, inhibiting latching to a DC state using a capacitance, and inhibiting relaxation oscillations using a high pass filter, and varying gain over time to improve phase noise performance. The oscillator may comprise a clock source to excite oscillations in the oscillator core at a frequency close to the resonator frequency to inhibit unwanted oscillations.

20 Claims, 26 Drawing Sheets

(56) References Cited

U.S. PATENT DOCUMENTS

| | | |
|---|---|---|
| 7,362,193 B2 | 4/2008 | Mattisson |
| 7,482,888 B1 | 1/2009 | Kleveland |
| 7,545,229 B2 | 6/2009 | Rohde et al. |
| 8,040,190 B2 | 10/2011 | Ruffieux |
| 8,519,800 B1 | 8/2013 | Wagner et al. |
| 9,071,194 B1 | 6/2015 | Djahanshahi et al. |
| 2005/0231240 A1* | 10/2005 | Goldfarb ............... H03B 5/366 327/105 |
| 2006/0049883 A1 | 3/2006 | Mattisson |
| 2009/0039970 A1 | 2/2009 | Shen et al. |
| 2011/0291767 A1 | 12/2011 | Ishikawa et al. |
| 2014/0070897 A1 | 3/2014 | Brekelmans et al. |

OTHER PUBLICATIONS

Shi et al., "A Sub-100uW 2GHz Differential Colpitts CMOS/FBAR VCO" IEEE Custom Integrated Circuits Conference, 2011, pp. 4 pages.

Westra et al., "Resonance-Mode Selection and Crosstalk Elimination Using Resonator-Synchronised Relaxation Oscillators", Proc. of European Solid-States Circuit Conference, 1998, 4 pages.

U.S. Appl. No. 13/909,739, Office Action dated Sep. 19, 2014.

U.S. Appl. No. 13/909,739, Notice of Allowance dated Feb. 23, 2015.

U.S. Appl. No. 14/335,842, Office Action dated Jun. 25, 2015.

U.S. Appl. No. 61/919,813, filed Dec. 23, 2013.

* cited by examiner

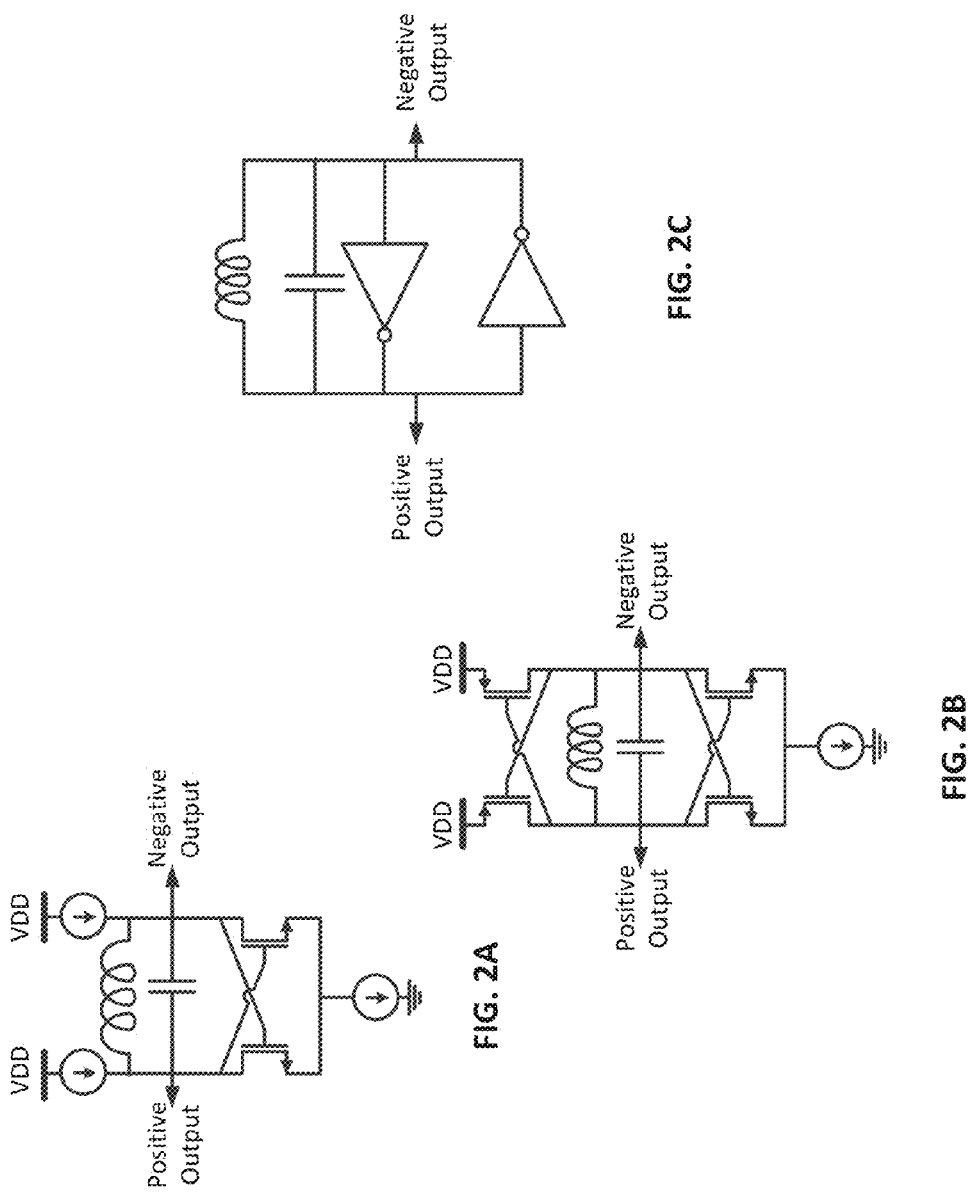

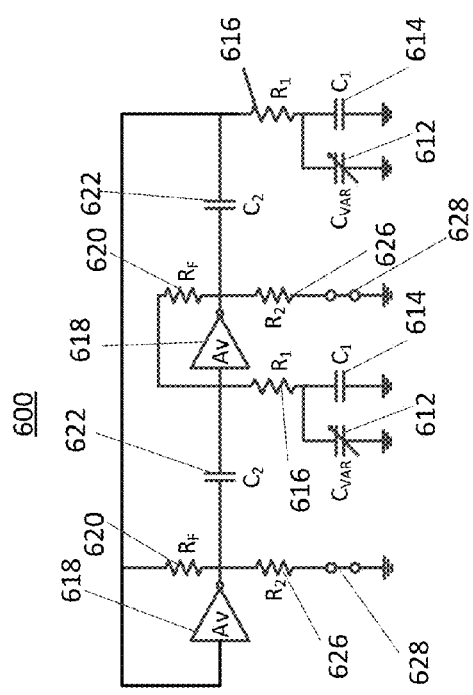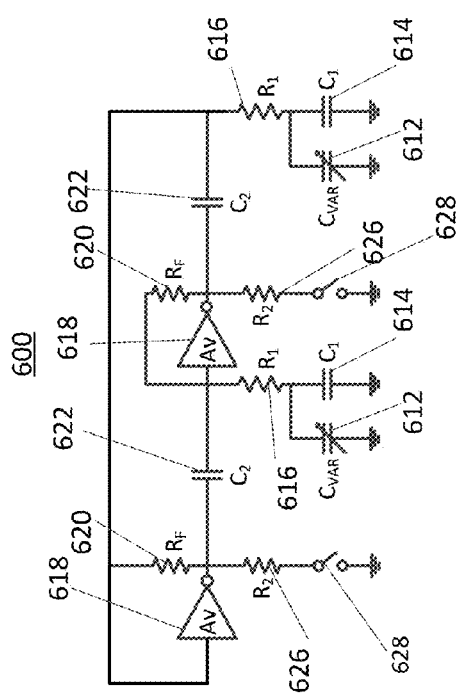

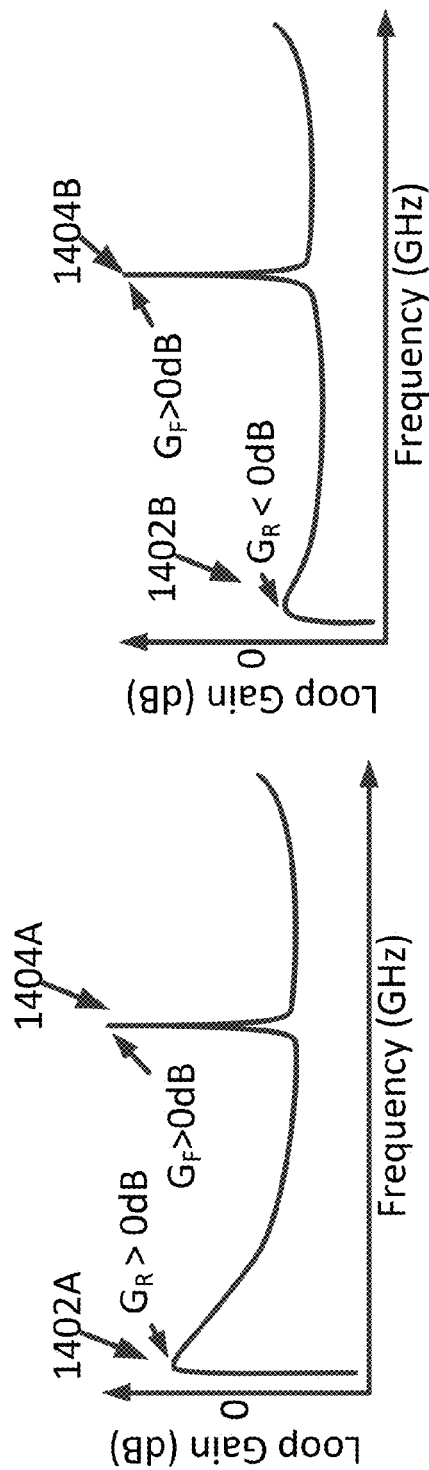
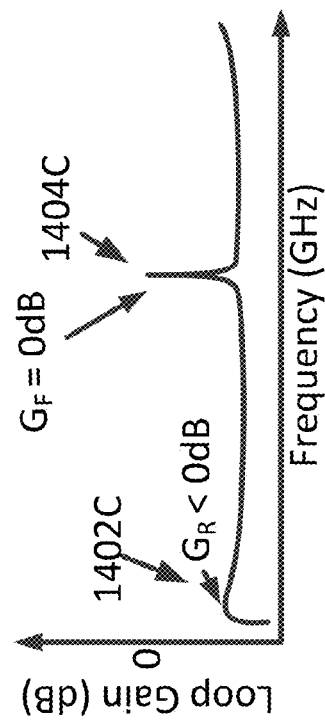
FIG. 14A
FIG. 14B
FIG. 14C

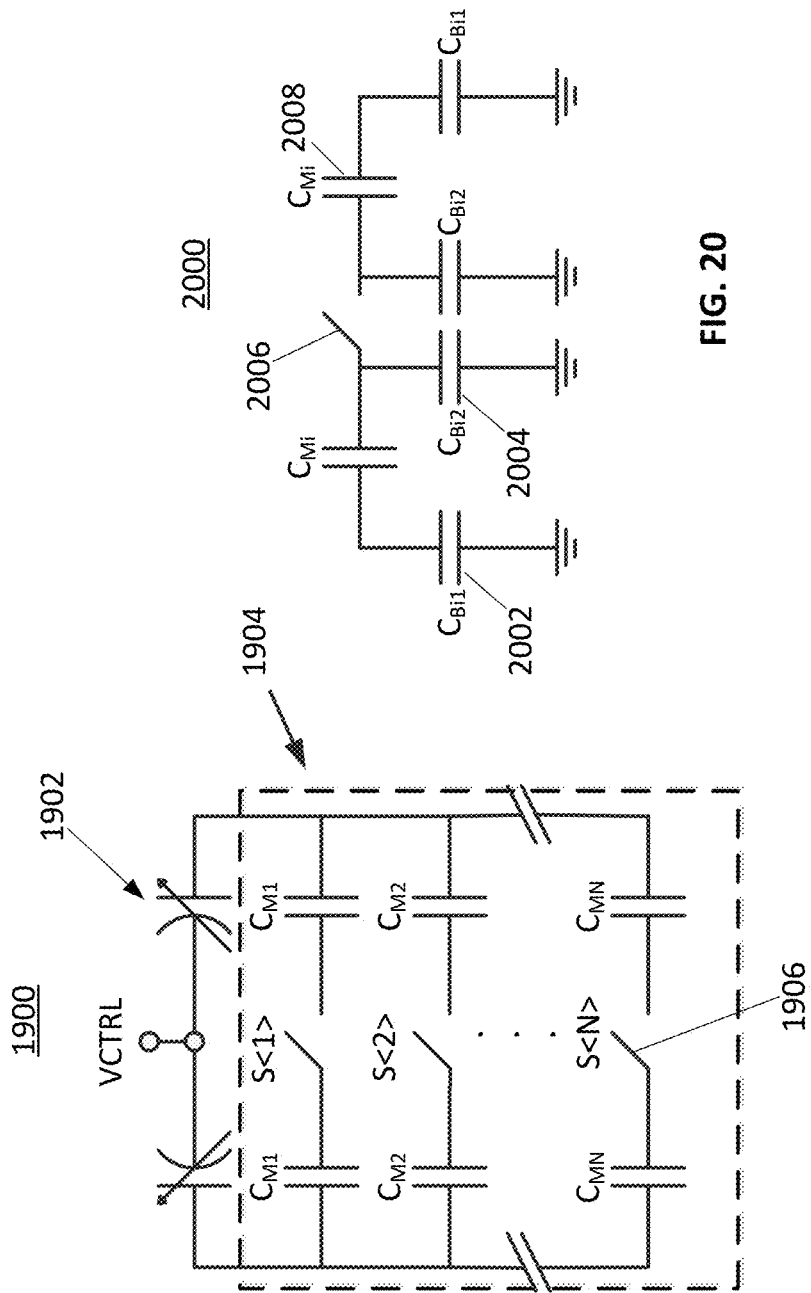

VARIABLE GAIN ELECTRO-MECHANICAL OSCILLATOR AND METHOD FOR STARTING BALANCED OSCILLATIONS

FIELD

The present disclosure relates to the field of oscillators. More particularly, the present disclosure relates to balanced oscillators using an electro-mechanical resonator.

BACKGROUND

Oscillators are electrical devices that generate an oscillating or repetitive signal (oscillations). Oscillations comprise a voltage which varies in magnitude and sign over time. Oscillations can be a sinusoidal wave, such as in an analog signal, or a square wave, such as in a digital electronic signal. Oscillations generated by an oscillator, especially electronic signals, have a number of applications such as, for example, a precise reference clock source in a voltage-controlled oscillator for frequency tuning, a reference clock source in a phase-locked loop (PLL) for locking onto another signal, or a frequency synthesizer to generate many other frequency references required in specific applications including microprocessors, wireline (tethered) or wireless communication systems, and application-specific integrated circuits (ASICs).

Oscillators comprise a resonator and an oscillator core. The resonator creates the oscillations and the oscillator core provides power to the resonator to initiate and sustain oscillations. A resonator can be, for example, an inductor-capacitor (LC) resonator or an electro-mechanical resonator. LC resonators comprise an inductor and a fixed capacitor in a series or parallel configuration. A variable capacitor can also be added to an LC resonator to tune the frequency of oscillations produced by an oscillator comprising an LC resonator. Compared to an electro-mechanical resonator, an LC resonator is typically better suited for oscillators where the frequency needs to be tunable.

The use of an electro-mechanical resonator, such as a piezoelectric resonator, in place of an LC resonator can improve the quality (spectral purity) of the oscillations in an oscillator. The quality factor of a resonator determines how damped its oscillator is—the higher the quality factor, the lower the rate of energy loss relative to the stored energy of the resonator. LC resonators in an integrated circuit (IC), for example, have a quality factor between 5 and 25. The quality factor of an electro-mechanical resonator can be 10 to 100 times higher than that of an integrated LC resonator.

When an electro-mechanical resonator is used with a differential oscillator, that has a common-source cross-coupled transistor oscillator core, to produce balanced oscillations, however, issues are introduced with respect to the oscillator latching to a static direct current (DC) state. Unlike an LC resonator, an electro-mechanical resonator has a very high impedance at low frequency and acts like an open circuit at DC. Although not an issue for single-ended oscillators, the high impedance at DC causes the cross-coupled transistors in a differential oscillator to become a latch with a very high DC gain so as to prevent the oscillations from starting in the oscillator. Accordingly, electro-mechanical resonators are commonly used in three-point (also known as single-ended) oscillator topologies, such as Colpitts, Pierce, and Hartley oscillators, which do not suffer from the latching problem.

FIGS. 1A, 1B and 1C show three-point electro-mechanical oscillators. Three-point oscillators, however, only provide a single-ended output signal, not a differential output signal. The differential output signals, as produced by a cross-coupled oscillator with an LC resonator, have a better common-mode noise rejection and an increased oscillation swing across the resonator as compared to the single-ended output signal. The increased oscillation swing improves signal-to-noise ratio (SNR) and hence the oscillator's phase noise.

One known approach to address the latching issue is to place a degeneration capacitor in series with source terminals of the cross-coupled differential pair NMOS (or PMOS) transistors. This breaks the loop formed by the differential pair transistors and the resonator at DC, while closing the loop as desired at high frequencies. Source degeneration capacitors, however, cannot be used with oscillators comprising complementary cross-coupled inverters where each inverter comprises an NMOS and a PMOS transistor forming a complementary metal-oxide-semiconductor (CMOS) inverter gain stage. There are potential advantages to using complementary cross-coupled inverters in an oscillator such as, for example, boosting transconductance gain ($g_m$) and improving the oscillation swing and phase noise. Adding capacitors to the source with cross-coupled complementary oscillators comprising a pair of NMOS and PMOS transistors would decrease the signal swing and phase noise performance of oscillations in the oscillator. Furthermore, placing a capacitor in parallel with inverters and connected to the source of the transistors could result in unwanted parasitic relaxation oscillations. Whether relaxation oscillations occur depends on the resistance and capacitance values in the DC-blocking path of the oscillator. Stability analysis can be performed to determine the largest capacitor possible to avoid relaxation oscillations, but at the expense of lower signal swing and worse phase noise performance, as well as increased design complexity. Accordingly, it would be desirable to have a cross-coupled complementary oscillator comprising an electro-mechanical resonator that does not latch to DC or experience relaxation oscillations.

Some oscillator applications, such as in telecommunications or instrumentation, require oscillations with a very precise and accurate frequency to the order of tens of parts per million (ppm) or smaller. Resonators that are built into oscillators, however, can have frequency variations in hundreds or thousands of ppm for various reasons including, without limitation, fluctuations in temperature, manufacturing variations, and degradation of electronics characteristics over time, also known as aging. A variable capacitor may be placed in parallel with the resonator and the oscillator core to tune the oscillations to the desired frequency using a control voltage applied to the variable capacitor. The capacitance, along with the parasitic trace or package inductance from attaching the capacitor to the circuit or other inductances can resonate together, however, and cause the oscillator to oscillate at undesired parasitic frequencies (also referred to as parasitic mode oscillations or parasitic package-mode oscillations) rather than at the resonator frequency. This is because the parasitic inductance and variable capacitance structures have a lower quality (Q) factor than the resonator allowing the parasitic oscillations to build, more quickly in the oscillator than the desired resonator frequency oscillations. Parasitic mode oscillations tend to occur at frequencies higher than the resonator frequency. Accordingly, it would be desirable to have a tunable oscillator comprising an electro-mechanical resonator which does not suffer from parasitic mode oscillations.

BRIEF DESCRIPTION OF THE DRAWINGS

FIG. 2A shows a differential LC oscillator with two Pierce oscillators.

FIG. 2B shows a differential LC oscillator similar to the oscillator of FIG. 2A.

FIG. 2C shows an alternate embodiment of the differential LC oscillator shown in FIG. 2B

FIGS. 13A and 13B show simplified circuit diagrams of the oscillator of FIG. 6 at low frequencies, with a switchable resistor when disabled and enabled, respectively.

FIGS. 14A-C show the open loop gain in decibels (dB) versus frequency (GHz) for various configurations of the oscillator of FIG. 6.

FIG. 19 shows a capacitor bank for use with the oscillator of FIG. 6.

FIG. 20 shows a branch of the capacitor bank of FIG. 19.

DETAILED DESCRIPTION

This disclosure describes a cross-coupled complementary balanced voltage controlled oscillator and a method for generating tunable balanced oscillations. Commonly assigned U.S. patent application Ser. No. 14/335,842 and entitled "ELECTRO-MECHANICAL VOLTAGE-CONTROLLED OSCILLATOR AND A METHOD FOR GENERATING TUNABLE BALANCED OSCILLATIONS", filed on Jul. 18, 2014, is hereby incorporated herein by reference in its entirety.

The oscillator in accordance with an embodiment of the present disclosure comprises an electro-mechanical resonator, and a programmable oscillator core. The oscillator core is programmable such that the gain it contributes to oscillations in the oscillator may be varied. The oscillator core comprises cross-coupled complementary programmable inverters with capacitors connected to the outputs of the inverters, and a resistor network. The capacitors inhibit the inverters from latching to a static direct current (DC) state. The resistor network, when connected to the oscillator, forms a high pass filter with the capacitors to inhibit relaxation oscillations. The inverters are programmable such that their total gain can be varied over time. The method comprises starting balanced oscillations in the oscillator with a low gain to inhibit parasitic-mode oscillations, inhibiting latching to a DC state using a capacitance, and inhibiting relaxation oscillations using a high pass filter. The method may also comprise increasing the gain to further inhibit parasitic oscillations while improving the phase noise and amplitude of the oscillations.

In accordance with another embodiment of the present disclosure, the oscillator comprises an auxiliary or external clock source which injects oscillations into the oscillator at a frequency, which is close to the desired resonator mode frequency, in order to avoid oscillations at unwanted frequencies (also referred to as unwanted oscillation modes). The desired resonator mode frequency is typically the fundamental mode frequency and not the overtone modes which are typically unwanted oscillation modes. Low-frequency parasitic relaxation-mode oscillations and higher-frequency parasitic package-mode oscillations are also unwanted oscillation modes. Once oscillations in the oscillator have reached a steady state, oscillations from the auxiliary or external clock source are no longer injected into the oscillator.

Other aspects and features of the present disclosure will become apparent to those ordinarily skilled in the art upon review of the following description of specific embodiments in conjunction with the accompanying figures.

Before discussing these embodiments in detail, a more detailed description of electro-mechanical oscillators is provided.

Figure 1C:
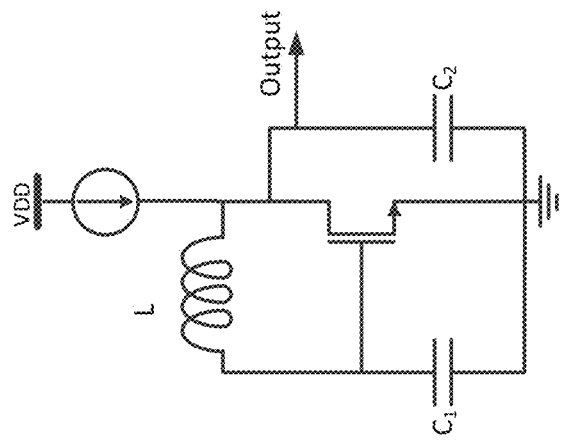
FIG. 1C shows a Pierce oscillator similar to the oscillator shown in FIG. 1A with an inductor in place of a piezoelectric resonator.
Figure 1B:
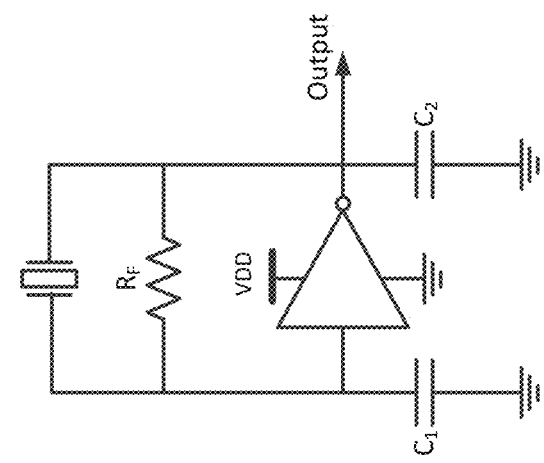
FIG. 1B shows an inverter based Pierce oscillator similar to the oscillator shown in FIG. 1A.
Figure 1A:
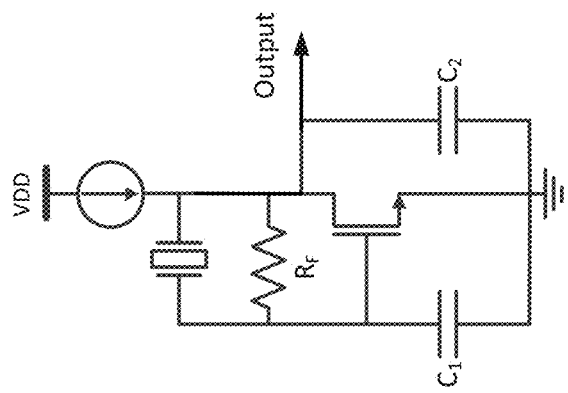
FIG. 1A shows a Pierce oscillator with a single transistor and a piezoelectric resonator.

As described in the background section, FIGS. 1A-C show single-ended oscillators. FIG. 1A shows a Pierce oscillator with a single transistor and a piezoelectric resonator. A feedback resistor ($R_F$) determines a bias point. The feedback resistor is sufficiently large to not impact the oscillator during operation. Capacitors $C_1$ and $C_2$, together with the piezoelectric resonator determine the phase shift necessary to cause oscillations in the oscillator. The transistor starts and maintains oscillations in the oscillator by providing loop gain and hence replenishing energy loss (e.g. losses from the resonator, capacitor, and/or interconnections) due to the finite Q of the resonator. The gain and phase conditions to sustain oscillation are collectively known as Barkhausen criteria. FIG. 1B shows a Pierce oscillator similar to the oscillator shown in FIG. 1A, the difference being that the current source is replaced with a PMOS transistor. The PMOS transistor's gate is connected to the gate of the NMOS transistor to create a CMOS inverter with $g_m$-boost. FIG. 1C shows an oscillator similar to the oscillator shown in FIG. 1A, the difference being that the oscillator uses an inductor instead of the piezoelectric resonator. The feedback resistor is not required because the inductor provides the DC bias path for the transistor input. The Q factor of the inductor is much smaller than that of the piezoelectric resonator in FIGS. 1A and 1B.

A balanced or differential oscillator can provide oscillations with less phase noise, better clock symmetry, and better common-mode noise immunity than oscillations from a single-ended oscillator.

FIGS. 2A-C show differential or cross-coupled oscillators having an LC resonator. FIG. 2A shows a differential LC oscillator with two Pierce oscillators, similar to as shown in FIG. 1C, in a back-to-back configuration. The transistors are cross-coupled to one another and, accordingly, this type of oscillator is also known as a cross-coupled oscillator or negative-$g_m$ oscillator. The oscillator also has a common-source. FIG. 2B shows a differential LC oscillator similar to the oscillator of FIG. 2A, the difference being that the oscillator also has a pair of cross-coupled PMOS transistors. This type of oscillator is known as a cross-coupled complementary oscillator. Since the oscillator has $g_m$-boost and symmetric circuitry, it achieves a higher oscillation swing and better phase-noise performance as compared to the oscillator of FIG. 2A. The oscillator is typically used in systems-on-chips for different applications because of its high performance and easy on-chip integration, which allows for compact implementations. FIG. 2C shows an alternate embodiment of the differential LC oscillator shown in FIG. 2B, the difference being that it does not have a tail current source.

A differential oscillator comprising an electro-mechanical resonator, however, has a very high open-loop DC gain which can cause the oscillator to latch to static DC levels to prevent oscillations. Specifically, at DC where the oscillation frequency f is equal to 0, the resonator is capacitive and has infinite impedance. The oscillator reduces simply into a back-to-back inverter (a.k.a. flywheel) configuration where the positive feedback of the flywheel amplifies the noise or mismatch so that the output will latch to static voltage levels, namely, the voltage level of the supply rails. As a result, this type of oscillator circuit cannot "self-start" the oscillation. This is unlike an LC resonator based cross-coupled oscillator where at DC the parallel LC resonator is essentially a short circuit. The short circuit is due to the inductor, which suppresses the DC gain. The prior art attempts to address the described start-up problem with electro-mechanical resonators by adding one or more components such as DC-blocking capacitors, feedback loops, and second resonators. These components add extra cost and complexity to the oscillator, reduce signal swing, degrade noise performance, and push the DC latch problem to a higher frequency so as to cause relaxation oscillations.

Figure 3B:
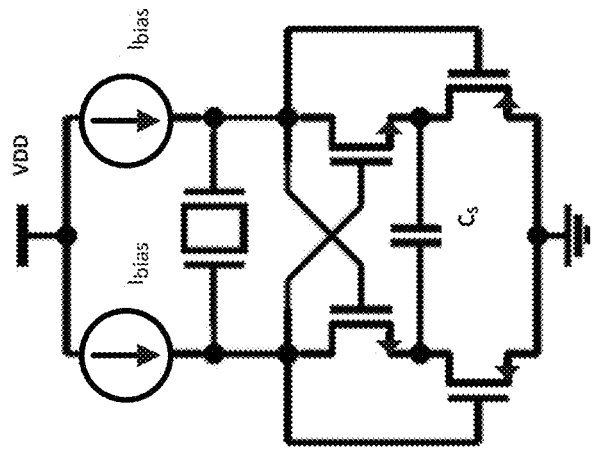
FIG. 3B shows an enhanced cross-coupled oscillator similar to the oscillator of FIG. 3A.
Figure 3A:
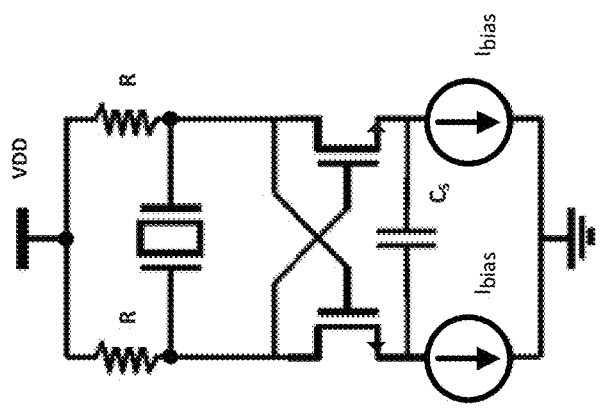
FIG. 3A shows a cross-coupled oscillator with an electro-mechanical resonator.

FIG. 3A shows a cross-coupled oscillator as described in *Resonance-Mode Selection and Crosstalk Elimination Using Resonator-Synchronized Relaxation Oscillators*, J. R. Westra et al., *Proc. of European Solid-States Circuit Conference*, 1998. The oscillator comprises cross-coupled NMOS transistors and an electro-mechanical resonator. The sources of the NMOS transistors are connected by a capacitor $C_S$. The capacitor opens the loop formed by the transistors and resonator at DC and closes the loop as desired at high frequencies to provide the required gain for oscillations to start. Although the capacitor helps inhibit the oscillator from latching to DC, this configuration suffers from several drawbacks such as spurious relaxation oscillations and inferior phase noise performance. At low frequency, when the oscillator is starting operation, the resonator still has very high impedance. This can cause relaxation oscillations to occur in the oscillator. The relaxation oscillations predominantly depend on the value of the capacitor $C_S$, combined with impedances seen at the source of the cross-coupled pair. The relaxation oscillation could occur at the same time as the main oscillation so as to appear as sidebands in the output signal. Alternatively, the relaxation oscillation could overcome the main oscillation. Stability analysis can be performed to determine the largest capacitor possible to avoid relaxation oscillations, but at the expense of lower signal swing and worse phase noise performance. The gate bias voltage is also not deterministic and relies on the current sources and the resistors.

FIG. 3B shows a cross-coupled oscillator similar to the oscillator of FIG. 3A, the difference being that the current sources are replaced with a second pair of NMOS transistors, the gates of which are connected to the drains of the first pair of NMOS transistors to set the drain common-mode voltages by providing DC feedback. However, due to headroom limitations from the stacked transistors, this oscillator still suffers from a low voltage swing and degraded phase noise.

Figure 4B:
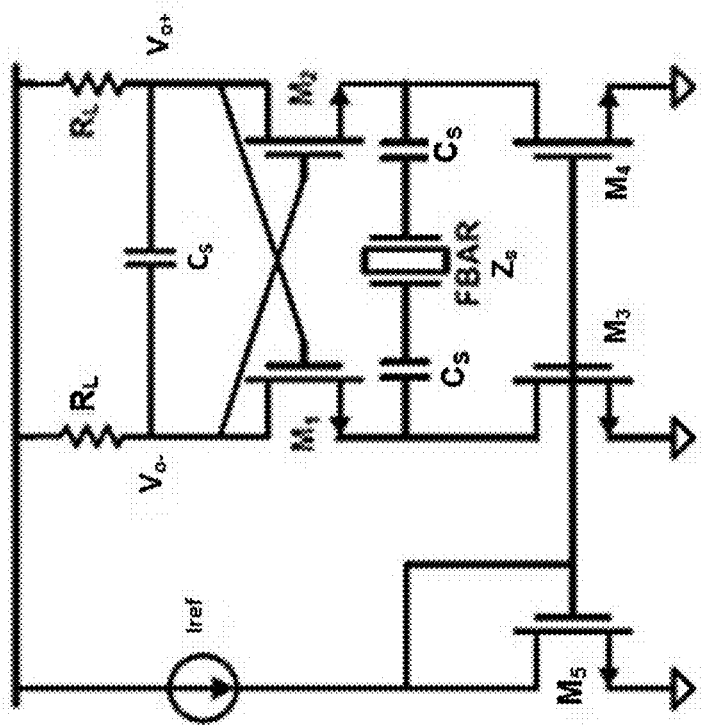
FIG. 4B shows a balanced oscillator with the electro-mechanical resonator and DC-blocking capacitors at the source.
Figure 4A:
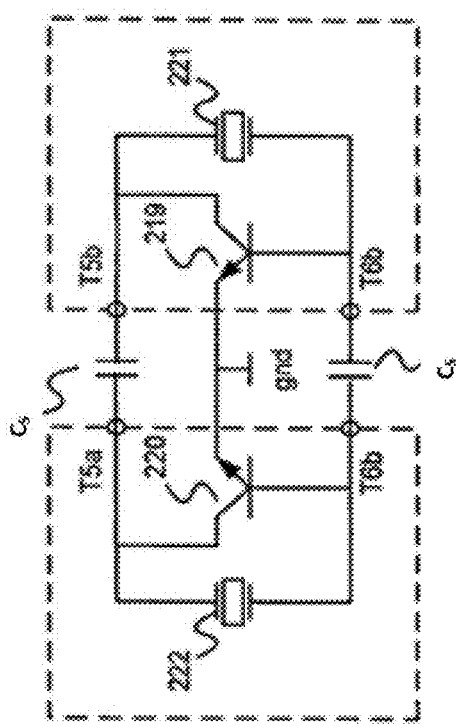
FIG. 4A shows a bipolar balanced oscillator having two electro-mechanical resonators and DC-blocking capacitors.

FIG. 4A shows a bipolar balanced oscillator having two resonators and blocking capacitors as described in U.S. Pat. No. 7,362,193 to Mattisson. Since two resonators are required, however, this increases the amount of area used in an IC package or on a printed circuit board, and increases the bill of materials. Also, mismatch of the resonators can affect circuit performance.

FIG. 4B shows a balanced oscillator as described in *A 50 ppm 600 MHz Frequency Reference Utilizing the Series Resonance of an FBAR*, Brian Otis, *IEEE Radio Frequency Integrated Circuits Symposium*, 2010. The resonator is located between, but isolated by capacitors from, the sources of the cross-coupled transistors to eliminate the DC gain. The cross-coupled loop closes at the resonance frequency formed by the thin-film bulk acoustic wave resonator (TF-BAR or FBAR) in series with capacitors C. The oscillator suffers from phase noise degradation and may potentially oscillate at unwanted frequencies.

Figure 5A:
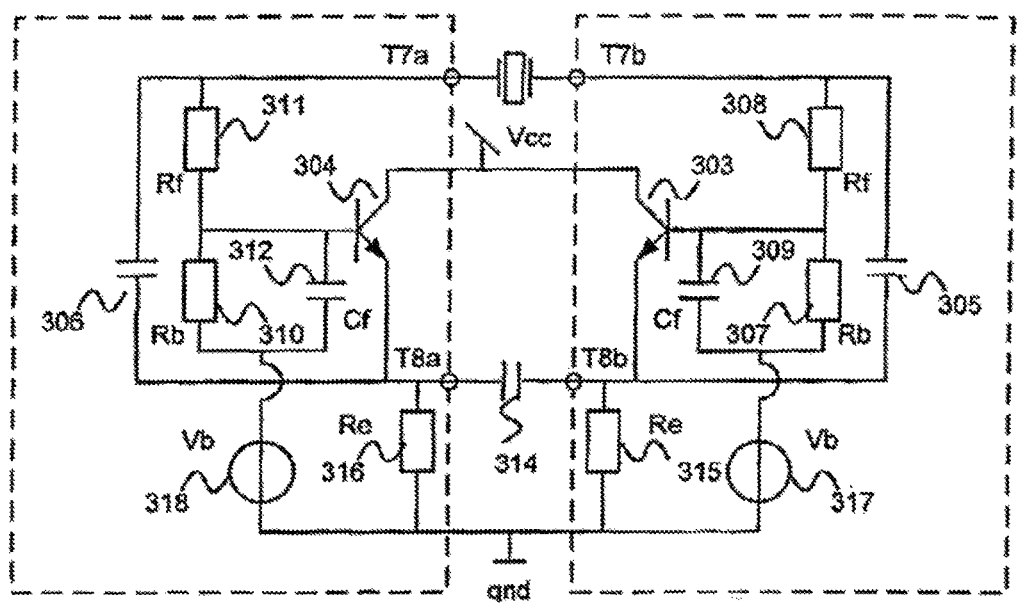
FIGS. 5A and 5B show Colpitts differential oscillators having an electro-mechanical resonator.
Figure 5B:
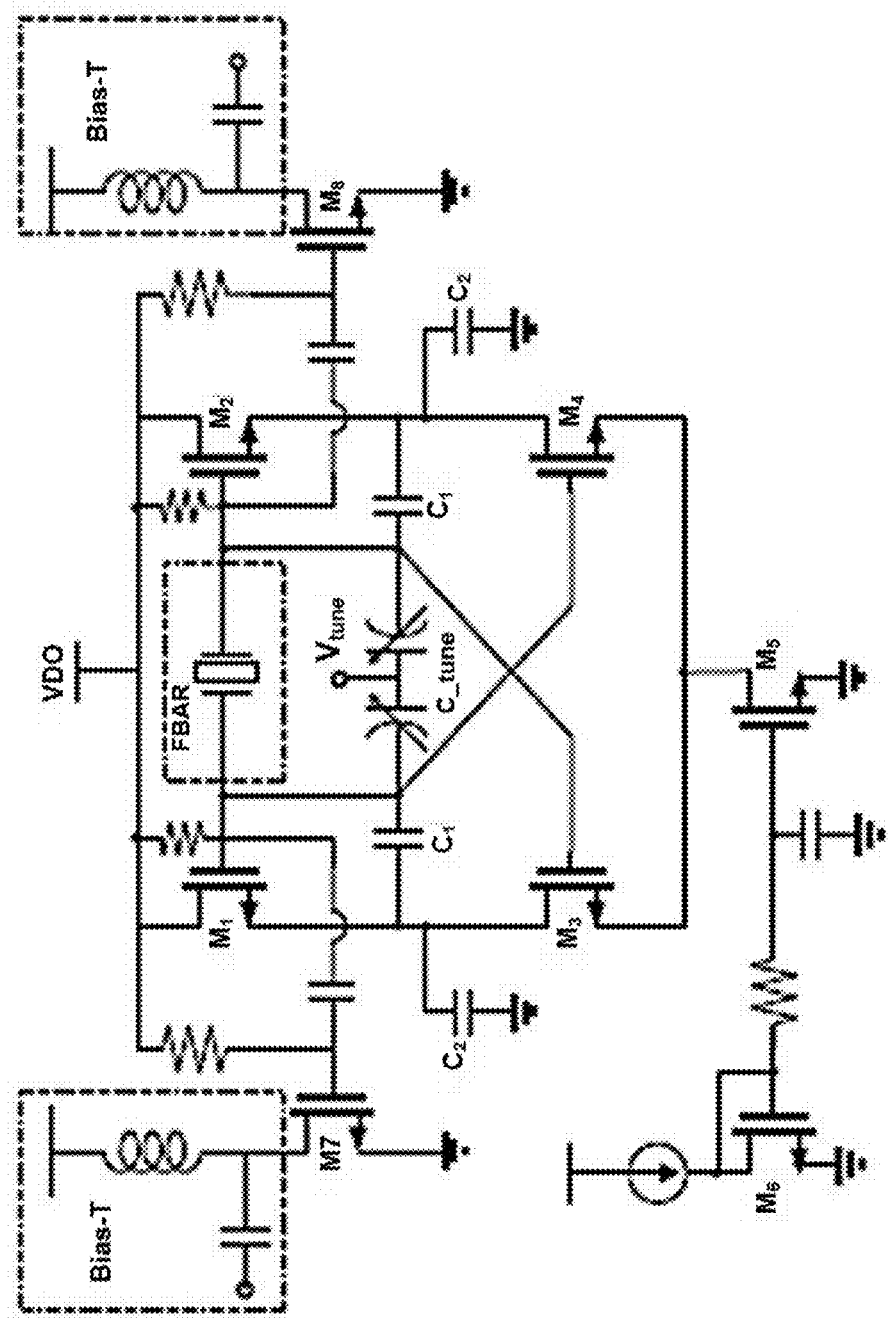

FIGS. 5A and 5B show Colpitts differential oscillators having a piezoelectric resonator as disclosed in U.S. Pat. No. 7,362,193 to Mattisson and *A Sub-100uW 2GHz Differential Colpitts CMOS/FBAR VCO*, Brian Otis, *IEEE Custom Integrated Circuits Conference*, 2011, respectively. Each oscillator has a pair of cross-coupled transistors that share a common-drain. The output of each oscillator is at the source of the transistors, while in a Pierce oscillator the output is at the drain of the cross-coupled pair. Although the Colpitts oscillators do not have the DC latch problem, the oscillators require a biasing circuit and a lower voltage gain that requires $g_m$-boosting to help start the oscillations. This lowers the voltage headroom and complicates the oscillator design.

Commonly assigned U.S. Pat. No. 9,071,194, which is herein incorporated by reference in its entirety, discloses an oscillator and method for generating balanced oscillations using an electro-mechanical resonator and cross-coupled complementary transistors (also referred to as inverters). Complementary means a combination of a P-type transistor and an N-type transistor such as, for example, a complementary metal oxide semiconductor inverter also referred to as a CMOS inverter. To avoid the oscillator latching to DC, the oscillator starts the oscillations in single-ended mode by disabling one of the inverters. Starting in single-ended mode allows the oscillator to accumulate energy to kick-start the oscillator into balanced mode. Specifically, once oscillations are established, the oscillator transitions to differential or balanced mode by enabling both inverters. The oscillator also has a switchable bank of resistors in parallel with both inverters. The switchable bank of resistors is enabled to maximize shunt resistance at start-up, and disabled to minimize shunt resistance when transitioning to differential mode, then maximized again when operating in differential mode at steady state.

U.S. Pat. No. 7,482,888 discloses a single-ended oscillator having a piezo-electric resonator. A second oscillator applies an impetus signal via a capacitor to the resonator to reduce the start-up time for generating oscillations with the single-ended oscillator. The single-ended oscillator is not, however, tunable; and, similar to all three-point oscillators, is not prone to latching to a static DC state. Furthermore, this oscillator operates at a low frequency and, accordingly, does not suffer from high frequency parasitic mode oscillations due to parasitic inductance of the integrated circuit (IC) package. In a conventional low frequency electro-mechanical oscillator comprising a resonator mounted on printed circuit board (PCB) external to the oscillator IC, high frequency package mode oscillations do not occur. Any such unwanted package-mode oscillations would be at a frequency which is much higher than the main low frequency oscillation and could be easily filtered with a low-pass-filter without negatively affecting the desired oscillation.

In contrast to existing approaches, the present disclosure describes a cross-coupled complementary oscillator comprising an electro-mechanical resonator and an oscillator core that does not latch to a non-oscillatory DC stable state, that inhibits low-frequency relaxation mode oscillations, and which avoids high-frequency parasitic package modes of oscillation. In an embodiment, the oscillator commences oscillations directly in balanced mode. The gain contributed by the oscillator core to the oscillations is increased from a low gain setting to a high gain setting in a manner to improve phase noise, while avoiding high-frequency parasitic modes of oscillation. Note that the gain required to generate the natural oscillation frequency of the resonator is less than the gain which would cause the parasitic oscillation modes at higher frequencies. During the start-up phase, a low gain value is first set in the oscillator core. This low gain value is smaller than the gain which would cause the high-frequency parasitic mode oscillations. The gain is then increased in sufficiently small increments. The purpose of the gain ramp-up is to generate and sustain resonator mode oscillations and increase the oscillation amplitude to improve the phase noise, while avoiding triggering high-frequency parasitic mode oscillations. The gain increments are smaller than the difference between the required gain for the resonator mode oscillation and the required gain for the high-frequency parasitic mode oscillations. In this manner, if a gain value set in the oscillator core in an earlier step was smaller than the gain required for generating the resonator mode oscillation, an increased gain in a next step would not exceed the gain threshold that would trigger a high-frequency parasitic mode of oscillation. Once the resonator mode oscillations have started and acquired sufficiently large amplitude, they suppress other modes of oscillation, hence any amount of increase in the gain contributed by the oscillator core from this point on would not result in parasitic oscillations. Increasing the gain will increase the sinusoidal swing and improve the phase noise of oscillation (at the cost of increasing the power consumption) up to a point, beyond which the swing is limited, e.g. by the bounds imposed by power supply voltage, and the oscillation waveform is clipped and distorted. A gain increase above this point wastes power and can adversely affect the oscillation phase noise by creating high-frequency harmonic distortion.

In accordance with the present disclosure, the oscillator may comprise a resonator input configured to receive, from an electro-mechanical resonator, a resonator signal; an oscillator core comprising a first and a second cross-coupled complementary inverter forming a first loop and a second loop with the resonator input, respectively, wherein the inverters are programmable to contribute to the resonator signal a first gain or a second gain, to generate balanced oscillations in the oscillator; and wherein the first gain is less than an upper threshold gain required to generate parasitic-mode oscillations when starting balanced oscillations, and the second gain is equal to or greater than a lower threshold gain required to generate resonator-mode oscillations.

The oscillator may further comprise an inverter controller connected to the inverters, the inverter controller configured to program the inverters to contribute the first gain when starting the balanced oscillations.

The second gain may be equal to or greater than the upper threshold gain.

The inverters may be programmable to contribute to the resonator signal a third gain between the first gain and the second gain.

The inverter controller may be configured to increase the third gain contributed by the inverters from the first gain to the second gain by an amount less than the difference between the upper threshold gain required to generate parasitic-mode oscillations and the lower threshold gain required to generate resonator mode oscillations.

Each of the first gain and the second gain may be less than the maximum amount of gain collectively contributable by all of the inverters.

The first gain may be equal to or greater than the lower threshold gain required to generate resonator-mode oscillations.

The second gain may be equal to or less than an optimum power dissipation upper threshold gain amount.

The first and second inverters may comprise a first bank of inverters and a second bank of inverters, respectively.

The inverter controller may be configured to enable a first set of inverters in the banks of inverters and disable a second set of inverters in the banks of inverters to program the inverters.

Each inverter may comprise a first complementary transistor pair and a second complementary transistor pair, the first transistor pair connected to the oscillator core to contribute gain to the resonator signal, the second transistor pair in series with the first transistor to regulate the amount of power received to control the gain contributed by the first transistor pair according to a control voltage signal.

The inverter controller may comprise a digital counter connected to a digital-to-analog converter configured to output the control voltage signal.

The oscillator may comprise a process monitor unit configured to detect manufacturing process corner parameters of the inverters, wherein the first gain and the second gain of the inverters are programmed based on the detected manufacturing process corner parameters.

The oscillator may comprise an electro-mechanical resonator connected to the resonator input, the electro-mechanical resonator comprising a thin-film bulk acoustic resonator, a bulk acoustic wave resonator, a surface acoustic wave resonator, a micro-electro-mechanical system resonator, or a quartz crystal resonator.

The oscillator may comprise a first and second capacitor connected in series in the first and second loops to outputs of the first and second cross-coupled complementary inverters, respectively, the capacitors for inhibiting the cross-coupled complementary inverters from latching to a non-oscillatory direct current stable state when starting balanced oscillations; and the oscillator comprises a resistor connected to the capacitors and to the inverters for creating a high pass filter with the capacitors to inhibit relaxation-mode oscillations.

In accordance with another embodiment of the present disclosure, an oscillator for generating balanced oscillations comprises a resonator input configured to receive, from an electro-mechanical resonator, a resonator signal for creating oscillations in the oscillator; an oscillator core connected to the resonator input, the oscillator core for starting and sustaining balanced oscillations in the oscillator, the oscillator core comprising first and second cross-coupled complementary programmable inverters forming a first loop and a second loop with the resonator input, respectively, the inverters programmable to contribute a first amount of gain to the balanced oscillations, and contribute a second amount of gain, greater than or equal to the first amount of gain, to the balanced oscillations, wherein he first amount of gain is less than an upper threshold gain required to generate parasitic-mode oscillations when starting balanced oscillations, and the second gain is equal to or greater than a lower threshold gain required to generate resonator-mode oscillations; first and second capacitors connected in series in the first and second loops to outputs of the first and second cross-coupled complementary inverters, respectively, the capacitors for inhibiting the cross-coupled complementary inverters from latching to a non-oscillatory direct current stable state when starting balanced oscillations; and a resistor network connected to the capacitors and to the inverters for creating a high pass filter with the capacitors to inhibit relaxation-mode oscillations.

In accordance with another embodiment of the present disclosure, a method for generating balanced oscillations in an oscillator comprises: starting balanced oscillations in the oscillator using an electro-mechanical resonator and an oscillator core; inhibiting the oscillator from latching to a non-oscillatory direct current stable state using a capacitance in the oscillator core; inhibiting relaxation mode oscillations in the oscillator using a high-pass filter; and contributing a gain to the balanced oscillations using the oscillator core, the gain less than an upper threshold gain required to generate parasitic-mode oscillations, and the gain is greater than a lower threshold gain required to generate resonator-mode oscillations.

The method may further comprise increasing the gain contributed by the oscillator core to the oscillations.

The gain may be increased in response to oscillations reaching a steady amplitude state.

The method may further comprise increasing the gain contributed by the oscillator core to the oscillations by incremental amounts sufficient to avoid parasitic mode oscillations.

The method may further comprise detecting a manufacturing process corner parameter of the oscillator core, and selecting the gain in response to the detected process corner parameter.

The method may further comprise detecting a manufacturing process corner parameter of the oscillator core, and increasing the gain in response to the detected process corner parameter so that the gain is less than an amount sufficient to cause oscillations at a parasitic high frequency.

The method may further comprise detecting a manufacturing process corner parameter of the oscillator core, and increasing the gain in response to the detected process corner parameter so that the gain is less than an optimum power dissipation upper threshold.

Inhibiting relaxation mode oscillations may comprise enabling a resistor network to create the high-pass filter with the capacitance to inhibit relaxation oscillations in the oscillator, and in response to balanced oscillations in the oscillator at steady state, the method may comprise disabling the resistor network to disable the high-pass filter in the oscillator core to increase the amplitude and reduce phase noise of the balanced oscillations.

The resistor network may be disabled to disconnect the high-pass filter from the oscillator core when the gain at the balanced oscillation frequency is unity gain and gain at any other frequency is less than unity gain.

In accordance with another embodiment of the present disclosure, an oscillator for generating oscillations comprises a resonator input configured to receive, from an electro-mechanical resonator, a resonator signal for creating oscillations in the oscillator; an oscillator core connected to the resonator input, the oscillator core configured to contribute gain to the oscillations to generate balanced oscillations; and a clock source connected to the oscillator core, the clock source for injecting oscillations into the oscillator core at an injection frequency to inhibit oscillations at unwanted frequencies.

The oscillator core may comprise first and second cross-coupled complementary inverters forming a first loop and a second loop with the resonator input, respectively, the inverters for contributing gain to the oscillations.

The clock source may be connected to the oscillator core with a first switch.

The first inverter may be connected to the oscillator core with a second switch.

The clock source may be connected to the oscillator core with a first switch, the oscillator core further comprising a clock source controller connected to the first switch, the clock source controller configured to close the first switch when the oscillations are started in the oscillator.

The clock source controller may be configured to open the first switch in response to oscillations in the oscillator reaching a steady state.

The oscillator may further comprise a clock source controller connected to the first and second switches, the clock source controller configured to open the first switch in response to oscillations in the oscillator reaching a steady state, and close the second switch in association with opening the first switch, to generate balanced oscillations.

The cross-coupled complementary inverters may be direct-current—(DC) coupled to the resonator input.

The cross-coupled complementary inverters may be alternating-current—(AC) coupled to the resonator input through capacitors.

The oscillator may further comprise first and second capacitors connected in series in the first and second loops to outputs of the first and second cross-coupled complementary inverters, respectively, the capacitors for inhibiting the cross-coupled complementary inverters from latching to a non-oscillatory direct current stable state when starting balanced oscillations.

The oscillator may further comprise a frequency tuning network connected to the oscillator core to tune the frequency of the balanced oscillations.

The oscillator may further comprise a resistor network connected to the capacitors and the inverters for creating a high pass filter with the capacitors to inhibit relaxation-mode oscillations.

The resistor network may have a switchable connection to the inverters, the oscillator may further comprise a resistor network controller connected to the resistor network and configured to enable the switchable connection when starting the oscillations to create a high-pass filter with the capacitors to inhibit relaxation-mode oscillations, and to disable the switchable connection in response to balanced oscillations in the oscillator at steady state to increase the amplitude and reduce phase noise of the balanced oscillations.

The resistor network controller may be configured to disable the switchable connection when steady-state gain contributed to the balanced oscillation at a resonator mode frequency is at a unity gain, and gain contributed to the balanced oscillations at a second frequency is less than the unity gain.

The oscillator may further comprise a first and second self-biasing negative feedback resistors connected in parallel with the first and second inverters, respectively, to bias the first and second inverters at their maximum small-signal gain operating point such that the oscillator experiences maximum loop gain to start balanced oscillations.

The resistor network may comprise first and second resistors connected to outputs of the first and second cross-coupled complementary inverters, respectively; and the switchable connection may comprise first and second switches connected to the first and second resistors, respectively, the first and second switches for connecting the first and second resistors in series when the switches are enabled.

The frequency tuning network may comprise: a capacitor network having one or more switchable capacitors connected to the resonator input; and a frequency tuning controller for enabling the switchable capacitor connection to decrease the frequency of the balanced oscillations in the oscillator and for disabling the switchable capacitor connection to increase the frequency of the balanced oscillations in the oscillator.

The capacitor network may comprise switchable capacitors and a voltage-controlled variable capacitor.

The frequency tuning network may comprise an inductor in series with the resonator input for increasing an effective inductance in the oscillator to reduce the maximum amount of capacitance needed to achieve a lower limit frequency of balanced oscillations, while maintaining the minimum amount of capacitance needed to achieve an upper limit frequency of balanced oscillations.

The oscillator may further comprise an electro-mechanical resonator connected to the resonator input.

The resonator may be a thin-film bulk acoustic resonator, a bulk acoustic wave resonator, a surface acoustic wave resonator, a micro-electro-mechanical system resonator, or a quartz crystal resonator.

In accordance with another embodiment of the present disclosure, a method for generating oscillations in an oscillator comprises injecting external oscillations into an oscillator core of the oscillator; exciting, using the external oscillations, oscillations in the oscillator at a desired frequency; and sustaining the oscillations in the oscillator core using an electro-mechanical resonator.

During the step of injecting, the oscillations may be in single-ended mode; and during the step of sustaining, the oscillations may be in balanced mode.

In response to oscillations reaching a steady state, the oscillator core may be transitioned from generating single-ended mode oscillations to generating balanced mode oscillations.

The injection of external oscillations may be discontinued in response to the oscillations reaching a threshold amplitude.

The desired frequency may be a frequency dose to the resonator mode frequency of the electro-mechanical resonator.

Frequency synthesizers require tunable oscillators because of the frequency inaccuracies of the resonators, resonator frequency drift due to changes in temperature and aging, and variations in loading and drive strength of oscillator circuitry due to manufacturing tolerances. Oscillators comprising an electro-mechanical resonator such as a piezoelectric resonator can be tuned by adjusting the capacitance value in a resonator tank, either through voltage-controlled variable capacitors (varactors) or a switchable capacitor bank. There are limits, however, to the maximum-to-minimum (or on-to-off) capacitance ratio due to the parasitic capacitance in the oscillator circuitry and the Q value required for a particular application. In deep sub-100 nm CMOS, for example, an on-to-off capacitance ratio of 6-to-1 or smaller in a switchable capacitor bank may be achieved with a satisfactory Q value. Generally, however, a tunable oscillator comprising a piezoelectric resonator requires a higher on-to-off capacitance ratio. Furthermore, tuning the oscillator frequency by a linear amount requires an exponential change in capacitance, as further explained below in relation to FIGS. 18A and 18B. The present disclosure also describes an apparatus and method for reducing the required on-to-off capacitance ratio in a cross-coupled complementary balanced oscillator comprising an electro-mechanical resonator while maintaining a large tuning range.

Figure 6:
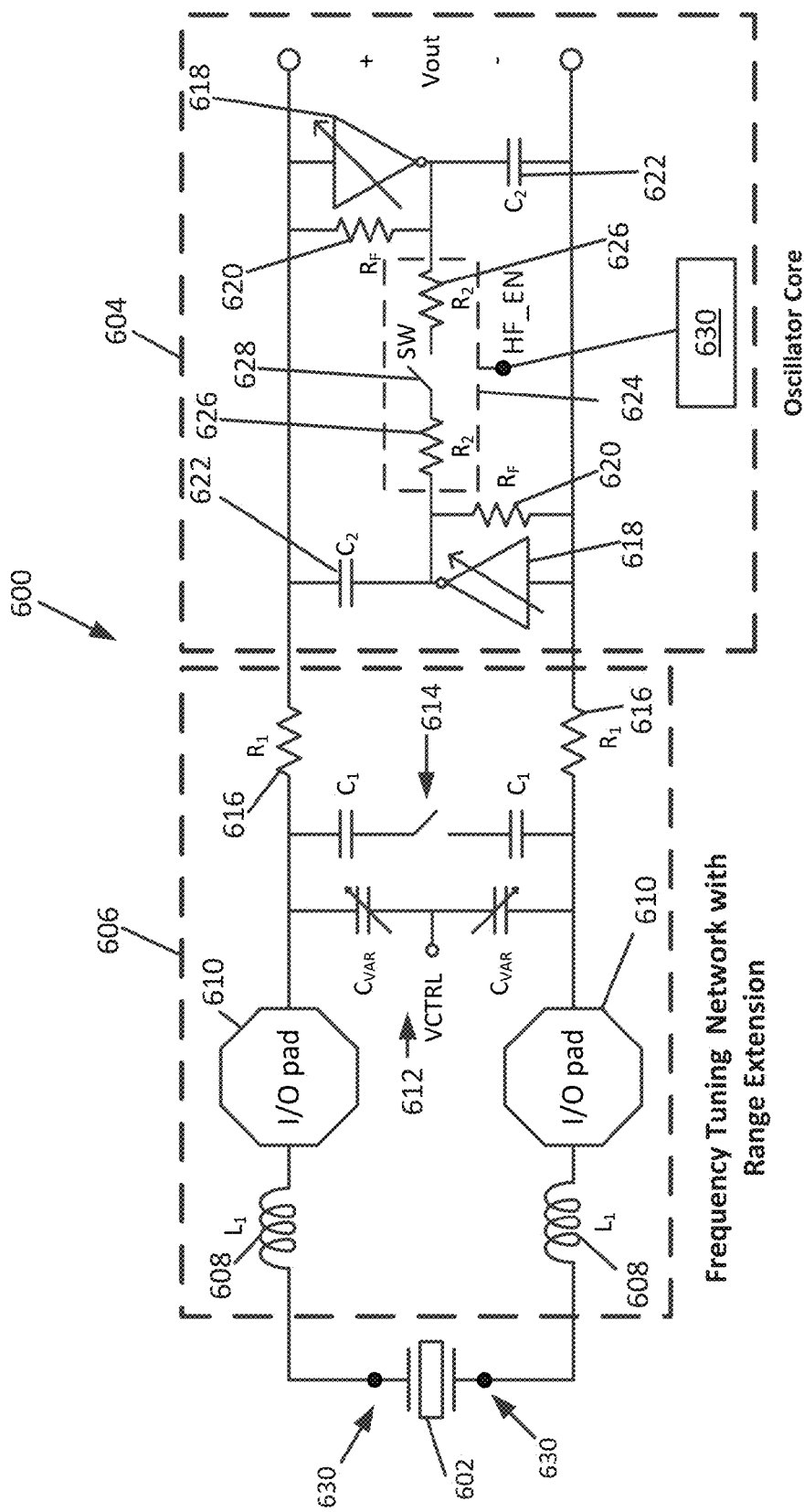
FIG. 6 shows a complementary cross-coupled voltage controlled oscillator in accordance with an embodiment of the present disclosure.

FIG. 6 shows a cross-coupled complementary voltage-controlled oscillator 600 (VCO) in accordance with an embodiment of the present disclosure. This oscillator 600 can be used in, for example, high performance phase-locked loops (PLLs) to generate a precise frequency reference that demands a very good phase noise performance. The oscillator 600 comprises an electro-mechanical resonator 602, an oscillator core 604, and a frequency tuning network 606. The resonator 602 is for creating a signal at a desired frequency while suppressing other frequencies, the oscillator core 604 is for contributing gain to the resonator signal for starting and sustaining the balanced oscillations, and the tuning network 606 is for extending the frequency tuning range of the oscillator 600.

The resonator 602 can be, for example, any high-Q resonator including, without limitation, a Film Bulk Acoustic Resonator (FBAR), Bulk Acoustic Wave resonator (BAW), a Surface Acoustic Wave resonator (SAW), a Micro-Electro-Mechanical System resonator (MEMS), or a quartz crystal (XTAL) resonator. The resonator 602 is connected in parallel with the frequency tuning network 606 and oscillator core 604. The resonator 602 is connected in series with inductors 608 and I/O pads 610 in the frequency tuning network 606. The resonator 602, inductors 608, variable capacitors (varactors or $C_{VAR}$s) 612, and switched capacitors 614 form a resonator tank.

In an embodiment of the present disclosure, the oscillator 600 comprises a resonator input 630. The resonator input 630 may be any electrical connection capable of receiving, so as being connected to, the resonator 602. The resonator input 630 is for connecting the resonator 602 to the other elements of the oscillator 600 as shown in FIG. 6. The resonator input 630 receives a resonator signal from the resonator 602 which is then used by the other elements in the oscillator 600 to create oscillations.

Resistors 616 connect the resonator tank to the oscillator core 604. Resistors 616 act as low-pass filters to help suppress unwanted high-frequency oscillations due to the parasitic inductances of the IC package, or overtone oscillation modes (harmonics) of the resonator 602 itself. The inductors 608 are implemented on the IC package as they require high Q. Integrated inductors on silicon are generally too lossy for high-performance applications. The inductors 608 can be implemented by means of traces on a flip-chip (FC) package, or bond wires in a more traditional wirebond IC package. Resistors 616 suppress the package resonance oscillation at an unwanted frequency created by 608, the on-die switched capacitors 614, the on-die varactors 612, and the parallel plate capacitance of resonator 602.

Parasitic mode oscillations are more likely to occur in oscillators operating at a high frequency or oscillators comprising a tuning network. With respect to oscillators operating in the multi-gigahertz frequencies, package inductances create high-frequency parasitic-mode oscillations with oscillations that are typically at a frequency which is only a couple of times higher than the frequency of the desired resonator oscillations. Because the frequencies are so close, low-pass filtering the parasitic mode oscillations may not be possible without adversely impacting the desired resonator oscillations. With respect to oscillators comprising a tuning network, the tuning capacitors tend to degrade (reduce) the peak gain of the oscillator at the desired resonator frequency, and also create a new undesired resonance mode based on the package parasitic inductances.

As shown in FIG. 6, the oscillator 600 comprises inductors 608. The inductors 608 improve the tuning range. The inductors may comprise traces in the IC package. The inductors 608, however, may increase the potential for high-frequency parasitic-mode oscillations by resonating with capacitances 612, 614 in the tuning network 606 and parallel plate capacitances of the resonator 602. A low-pass filter comprising small resistors 616 in series with the resonator and the oscillator core can help inhibit such parasitic mode oscillations from forming, but this is not an ideal solution as it degrades oscillation amplitude and phase noise. Furthermore, a fixed resistor value will not always work.

Variations caused by manufacturing process inaccuracies on NMOS/PMOS transistors can result in inverting gain stages (inverters) at typical/typical (TT), fast/fast (FF), or slow/slow (SS) manufacturing process corners. Also, temperature changes and long-term degradation over time (also referred to as aging) can cause variations in the amount of gain contributed by an inverter. Furthermore, the peak impedance $R_P$ value of the resonator at anti-resonance frequency $f_P$ as shown in and further discussed below in relation to FIG. 16, can vary by as much as a ratio of 2 to 1. Too large of a series resistor value 616 degrades the oscillation swing and hence phase noise in cases of low-$R_P$ resonators and low drive strength inverters (e.g. at SS process corner), and can also prevent the oscillator from oscillating at extreme corner cases. On the other hand, too small of a series resistor value 616 can allow high-frequency parasitic/package mode oscillations in cases of high-$R_P$ resonators and high drive strength inverters (e.g. at FF process corner). Accordingly, the value of the series resistor 616 would need to be carefully selected to balance phase noise performance versus the possibility of permitting incorrect oscillations.

Although a variable resistor, in place of the fixed resistor, could help compensate for the process corners during runtime, a variable resistor would require large switches which would have implementation drawbacks and also degrade the phase noise of the resonator.

In accordance with an embodiment of the present disclosure, the need to select the appropriate value of the resistor is avoided by instead controlling programmable inverters to contribute a gain to the resonator signal to create and sustain resonator mode oscillations and inhibit parasitic-mode oscillations. The inverters are programmed to start contributing at a low gain or the lowest gain. The gain is less than a threshold gain which would have been required to generate high-frequency parasitic-mode oscillations in the oscillator. The inverters can also be programmed to increase the gain they contribute to the oscillations. The amount by which the gain is increased may be a fraction of the difference in loop-gain cross-over between normal resonator mode and high-frequency parasitic-mode. The rate at which the gain is increased may be less than a threshold rate required to generate parasitic-mode oscillations. This helps ensure that only the desired resonator mode oscillations are sustained. Contributing variable gain may permit the resistor R1 616 in the oscillator 600 of FIG. 6 to be significantly reduced in size or, in some cases, entirely eliminated, which improves phase noise.

In addition to the above, it is desirable to control the total amount of loop gain contributed by inverters to an oscillator at steady state to maximize oscillation swing while avoiding oscillation distortion. If inverters create too little gain in the oscillator, this either dampens the amplitude of the oscillations, or causes oscillations with low amplitude. Low oscillation amplitude degrades the signal-to-noise ratio and hence the oscillator phase noise. By contrast, if an inverter contributes too much gain to the oscillations, this causes non-linearities and distortions (e.g., amplitude clipping) in the oscillations due to power supply voltage limits. This also increases the oscillations' harmonic content and degrades the phase noise. In accordance with an embodiment of the present disclosure, programmable inverters are used to vary the gain contributed to oscillations to help ensure that the total amount of loop gain contributed by the programmable inverters during steady state operation maximizes the swing of the oscillations but with minimum amplitude clipping and distortion of the oscillations.

Referring again to FIG. 6, in an embodiment of the present disclosure the oscillator core 604 comprises two programmable cross-coupled complementary PMOS-NMOS (CMOS) inverters 618, two self-biasing feedback resistors 620, two capacitors 622, a resistor network 624, and a controller 630. The cross-coupled complementary programmable inverters 618 each form a series circuit or loop with the resonator and resonator input. Of course, the loop may comprise other elements such as capacitors, resistors, and inductors. The inverters can comprise any type of transistors including, without limitation, metal-oxide-semiconductor (MOS) transistors, bipolar junction transistors (BJT), and junction field-effect transistors (JFET). The inverters contribute a gain to amplify the resonator signal so as to generate oscillations in the oscillator. Arranging the inverters in a cross-coupled complementary fashion results in balanced oscillations being generated. Balanced oscillations are symmetrical, or very close to symmetrical such that when oscillations reach a steady amplitude state they are symmetrical A self-biasing feedback resistor 620 is in parallel with each of the cross-coupled programmable inverters 618. The self-biasing feedback resistors 620 set a bias point of the inverters for maximum small-signal transconductance gain ($g_m$) in order to maximize the loop gain in the oscillator 600. A capacitor 622 is connected in series in each of the loops to the output of each cross-coupled programmable inverter 618. In other words, the terminals of each capacitor 622 connect the output of one inverter 618 to the input of the other inverter 618. The structure formed by inverter 618 and capacitor 622 is cross-coupled (connected back-to-back) with another structure formed by inverter 618 and capacitor 622. Effectively, the inverters 618 are capacitively cross-coupled with one another.

The capacitors 622 inhibit the cross-coupled complementary inverters 618 from latching to a direct current (DC) state when starting oscillations by breaking the positive feedback loop. This arrangement of the capacitors 622 effectively breaks the regenerative (positive) feedback loop of the cross-coupled complementary inverters 618 at DC, while shorting (closing) the loop at high frequencies. Although capacitors 622 serve a similar purpose as the capacitors in the prior art, the locations of the capacitors 622 are uniquely different. By breaking the loop at the outputs of the inverters 618 (drain of the transistors) with the locations of the capacitors 622, a complementary cross-coupled structure can be used together with an electro-mechanical resonator to produce a balanced output without latching to DC. Also, because there is no loop gain at DC, the oscillator 600 can immediately start building an oscillatory differential output signal when it first commences operation, and does not need to first start in single-ended mode.

The resistor network 624 comprises resistors 626 and a switchable connection 628 for connecting the outputs of the inverters 618 in series with the resistors 626. The resistor network 624 is also known as a switchable shunt resistor. The resistor network 624, in combination with the capacitors 622, provides a high pass filter to help eliminate unwanted low-frequency relaxation-mode oscillations. The switchable connection 628 is enabled and disabled according to a signal from the controller 630 at enable input HF_EN. In the embodiment of FIG. 6, the resistor network 624 comprises a pair of resistors 626 with a switchable connection 628 therebetween. In an alternate embodiment, the resistor network 624 comprises a pair of switchable connections 628 between a pair of resistors 626 to preserve full implementation symmetry. In a further embodiment, a resistor 626 can be placed in between two switchable connections 628. The resistor network 624 may comprise multiple branches of resistors paired with switchable connections to form an array of programmable switched resistors.

When oscillations are started in the oscillator 600, the controller 630 enables the switchable connection 628. When the resistor network 624 is connected to the oscillator 600, a high-pass filter is created by the capacitors 622 and the resistors 626. The high pass filter inhibits parasitic and undesirable relaxation-mode oscillations from occurring in the oscillator 600. In another embodiment, the resistor network 624 has no switchable connection so that it is always connected between the outputs of the inverters 618. This embodiment could be used for low-cost low signal performance applications.

The undesired relaxation-mode oscillations potentially created by time constants associated with the DC-blocking capacitors may be eliminated by a high-pass filter. When enabled, the switchable resistor network 624, in combination with the capacitors 622, create a high-pass filter to eliminate low-frequency relaxation-mode oscillations. Prior art approaches that use source degeneration capacitance also suffer from the potential relaxation oscillation problem. For the prior art, stability analysis needs to be conducted to determine a capacitance value that avoids creating relaxation oscillations without increasing the phase noise in the oscillations. On one hand, too small of a capacitance value increases phase noise due to lower loop gain and hence lower oscillation swing. On the other hand, too large of a capacitance value will create relaxation oscillations. In an embodiment of the present disclosure, a high-pass filter and a startup procedure for enabling and disabling the high-pass filter are provided to allow the oscillator 600 to maintain phase noise performance while eliminating the size constraint on capacitors 622 due to the stability limits. In other words, the capacitors 622 can be sized relatively large so that there is no phase noise degradation, and resistors 626 can be sized accordingly to filter out the relaxation gain to prevent the relaxation oscillation from building up at the start-up phase. When the oscillator 600 reaches steady state oscillations, high-pass filtering is no longer required because relaxation oscillations are already suppressed by the resonator oscillations and will not start in this state. Accordingly, the switchable resistor network 624 is disabled by opening the switch 628, and the branch becomes an open circuit to help achieve high swing and high phase noise performance. Alternatively, to reduce the controller complexity the switchable resistor network 624 can remain enabled, or simplified to a fixed resistor without a switch, for less demanding low-cost applications.

The inverters 618 are programmable so as to control the gain they contribute to start and sustain the oscillations in the oscillator. When starting oscillations in the oscillator 600, the inverters are programmed to contribute only a low amount of gain to the oscillations to avoid parasitic modes of oscillation, namely, high-frequency oscillations at undesired frequencies. This is because the gain required to sustain the natural oscillation frequency of the resonator is less than the gain which would cause the high-frequency parasitic oscillation modes. The period of time during which oscillations are started in the oscillator includes the period of time when oscillations first begin to form in the oscillator up until the time when oscillations have a sufficient amplitude or energy so as to inhibit parasitic-mode oscillations from occurring if there is a change in the gain contributed by the inverters. During startup, the gain may be increased or incremented in sufficiently small amounts or steps to continue to sustain resonator mode oscillations and inhibit parasitic-mode oscillations. After increases in gain, oscillations may temporarily fluctuate in amplitude. Typically, a period of time needs to occur before oscillations reach a steady amplitude state. After the startup phase, resonator mode oscillations are sufficiently large in amplitude between high and low voltages that any amount of increase in the gain contributed by the inverters would not result in parasitic-mode oscillations.

In an embodiment, the inverters 618 may be banks of inverters. The gain of some or all of the inverter of the banks of inverters may be programmable. An inverter is programmable if it can either be enabled or disabled or if the gain of the inverter can be selected to be a particular amount. The gain contributed by a bank of inverters may be selected by enabling a set of the inverters and disabling the remaining inverters. The gain of the programmable inverters of the banks of inverters may be programmed by an inverter controller. The inverter controller may be a controller which controls other aspects of the oscillator.

Figure 7:
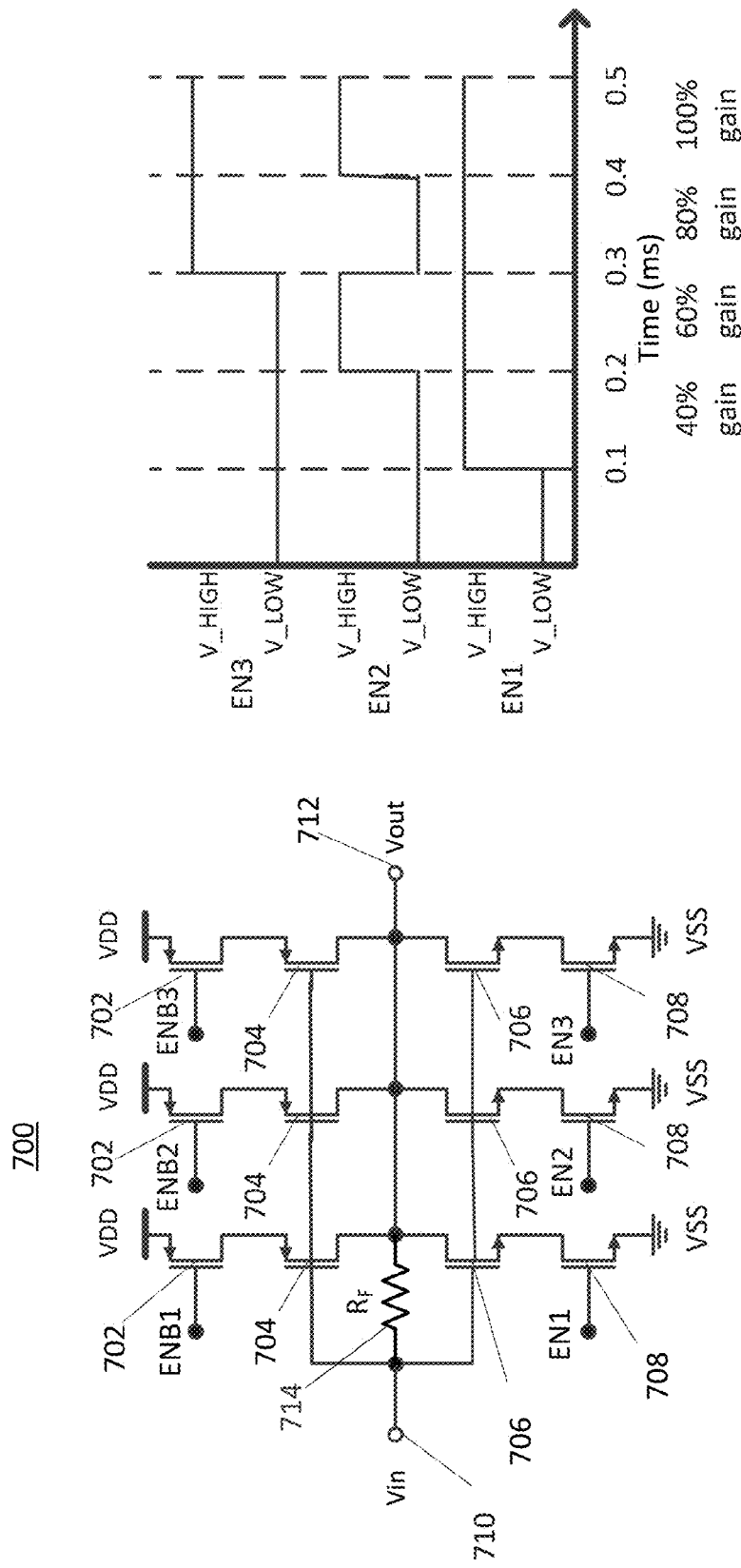
FIG. 7A shows an embodiment of a programmable inverter for use with the oscillator shown in FIG. 6 in accordance with an embodiment of the present disclosure.
FIG. 7B shows a timing diagram for controlling the programmable inverter shown in FIG. 7A.

FIG. 7A shows a programmable inverter 700 for use with the oscillator shown in FIG. 6 in accordance with an embodiment of the present disclosure. The inverter 700 comprises an input $V_{in}$ 710 which receives oscillations, multiple pairs of PMOS 704 and NMOS 706 transistors which contribute a gain to the oscillations, and an output $V_{out}$ 712 which outputs the amplified oscillations. Voltage supply VDD is connected to the source of PMOS transistors 702. The gate of the PMOS transistors 702 are connected to and controlled by active-low enable inputs ENB1 to ENB3, and ground voltage VSS is connected to the source of the NMOS transistors 708. The gates of the NMOS transistors 708 are connected to and controlled by active-high enable inputs EN1 to EN3. Inputs EN1 to EN3 and ENB1 to ENB3 receive complementary voltage signals, respectively, and simultaneously enable or disable the transistor switches 702 and 708. Inputs ENB1 to ENB3 and EN1 to EN3 are controlled by an inverter controller. The inverter controller may be a digital controller comprising a timer and sequential logic circuitry. The inverter controller may be connected to other elements of the oscillator 600 to coordinate the operation of the oscillator 600 with the operation of the programmable inverter 700. The gates of the PMOS and NMOS transistors 704, 706 are connected to an input 710, and the drains are connected to an output 712. Each pair of NMOS and PMOS transistor 704, 706 is individually enabled or disabled by ENB1 to ENB3 and EN1 to EN3 to control the amount of gain contributed by all of the transistors, collectively, to the oscillations. Depending on their respective transistor width-to-length ratios (W/L), a pair of transistors 704, 706 may contribute a different amount of gain to the oscillations than the other pairs of transistors. Negative feedback resistor 714 (which is similar to the feedback resistor 620 in FIG. 6) connects input 710 and output 712.

FIG. 7B shows a timing diagram for voltage levels V_LOW and V_HIGH at inputs EN1 to EN3 which would cause the programmable inverter 700 of FIG. 7A to incrementally increase the gain it contributes to oscillations in the oscillator 600 of FIG. 6. Inputs ENB1 to ENB3 receive voltage signals which are complementary (inverted) versions of the voltage signals received by inputs EN1 to EN3, respectively. As shown, the gain is incrementally increased over time by successively enabling the pairs of PMOS 704 and NMOS 706 transistors using inputs EN1 to EN3 and ENB1 to ENB3. In this timing diagram, the transistors controlled by EN1/ENB1 and EN3/ENB3 are sized such that each contribute 40% of the total driver gain to the oscillations, and the transistors controlled by EN2/ENB2 contribute the remaining 20% of the total driver gain to the oscillations. The timing diagram shows the inverters, collectively, contributing 40% gain when oscillations in the oscillator first commence at time≥0.1 ms and increasing the gain by increments of 20% at each successive 0.1 millisecond until the gain reaches 100% gain at time 0.5 ms.

Using programmable inverters to inhibit parasitic oscillations from forming avoids having to use filters comprising resistors, inductors, and capacitors, which would generally increase the area and cost associated with these passive components and degrade the oscillation swing, phase noise and tuning range of the oscillator.

Figure 8:
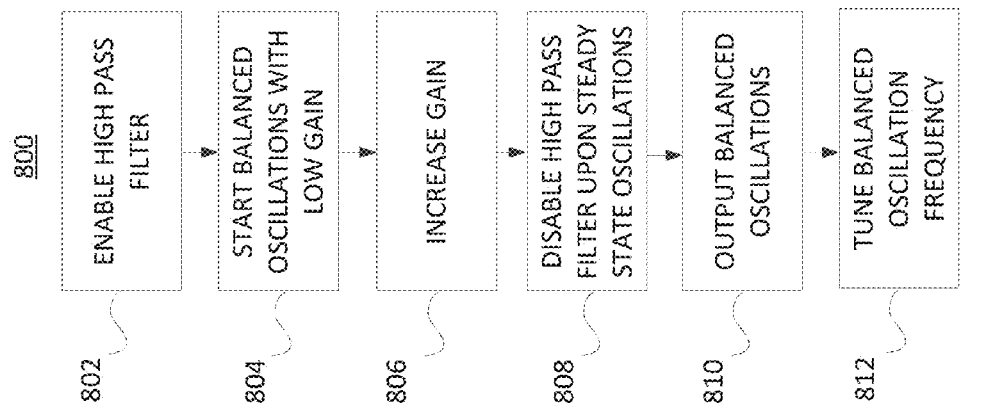
FIG. 8 shows a flowchart of a process for operating the oscillator of FIG. 6.

FIG. 8 shows a flowchart of a method 800 for operating the oscillator 600 of FIG. 6 in accordance with an embodiment of the present disclosure. The method comprises enabling a high pass filter 802 in the oscillator, starting balanced oscillations in the oscillator 804 with a low loop gain, increasing the loop gain 806, disabling the high pass filter 808 in response to oscillations reaching a steady state, outputting the balanced oscillations as a signal 810, and tuning the frequency of the balanced oscillations 812. In another embodiment, the high-pass filter is always enabled so that the step of disabling the high-pass filter 808 is not performed, thus reducing the control complexity. Although this latter embodiment suffers from phase noise degradation (i.e. increased phase noise), it may be used in low-cost, low-complexity, and low-performance applications.

Before starting the balanced oscillations 804, the controller 630 enables or activates the high-pass filter 802 by sending a signal to input HF_EN to enable the resistor network 624. Effectively, a signal at input HF_EN activates (closes) the switch 628 to connect the resistors 626 in the oscillator core 604 and form the high-pass filter with the capacitors 622 and the input impedance of the inverting gain stage.

To start oscillations 804 in the oscillator 600, a power supply voltage is applied to the oscillator core 604 to energize the circuitry of the oscillator 600. This causes the electro-mechanical resonator 602 to commence resonating at a frequency to produce balanced oscillations in the oscillator 600. The capacitors 622, which are at the output of the programmable inverters 618, inhibit the inverters 618 from latching to DC state. The high-pass filter is for eliminating relaxation mode oscillations, potentially caused by the capacitors 622 and feedback resistors 620, without affecting high-frequency gain at the desired oscillation frequency. The resistors 626 typically have small resistance values that help the high-pass filter provide attenuation at low frequencies.

When starting oscillations, the oscillator core 604 is set or programmed to contribute only a low gain to the oscillations. In an embodiment of an oscillator which comprises the inverters of FIG. 7A, the low gain is set by enabling, with inputs ENB1 to 3 and EN1 to 3, only certain pairs of NMOS and PMOS transistors. Which transistors are enabled depends, in part, upon the desired gain. An embodiment is shown in FIG. 7B. The gain at which the desired oscillations are started is sufficiently low to avoid high-frequency parasitic mode oscillations.

When the resistors 626 are connected, the oscillator 600 is considered to be in "low-swing" mode. In low-swing mode, the oscillator 600 can accumulate balanced oscillations to reach the desired oscillation frequency. The oscillator 600 then waits a period of time to allow balanced oscillations to stabilize at the desired frequency so as to reach a sustainable or steady-state large-signal operation. Sustainable or steady-state balanced oscillations are reached when the oscillation amplitude is stable which means that there is large-signal unity gain, or a gain of 0 decibels, at the desired oscillation frequency and the gain at any other frequency, such as relaxation frequency, is less than 0 decibels.

The loop gain is increased by enabling and disabling one or more of the EN1 to EN3 and their complementary ENB1 to ENB3 inputs. The programmable inverter controller waits a period of time after each increase in loop gain to permit the oscillation amplitude (swing) and/or frequency to stabilize before causing another increase in loop gain. The wait time after each loop gain increase may be pre-determined based upon the oscillator's design or oscillator simulations. Generally, oscillators with a higher Q factor require longer wait times between gain changes for oscillations to stabilize. The wait time after each loop gain may also be determined according to measurements of the oscillations at run-time. In an embodiment, the oscillator comprises an envelope detector and/or frequency counter to measure the oscillation amplitude or frequency, respectively, to determine whether the oscillations have stabilized. Measuring oscillations to determine when they have stabilized may reduce the wait time after each increase in gain. The loop gain may need to be increased slowly (using small steps with long wait times) to inhibit parasitic oscillation modes from occurring in the oscillator.

Once oscillations in the oscillator 600 reach a sustainable or steady-state large-signal at the desired frequency and amplitude (swing), the high pass filter is disabled 808 by the controller 630 by sending a signal to input HF_EN. This opens or deactivates the switch 628 which disconnects the resistors 626 from the oscillator 600 to create an open circuit. Disabling the high pass filter reduces phase noise by increasing the amplitude of the balanced oscillations in the oscillator. The balanced oscillations are output 810 by the oscillator as a differential signal. A differential signal comprises a pair of signals with common-mode noise rejection property, but a phase difference of 180 degrees.

The frequency of the balanced oscillations in the oscillator 600 can be tuned 812 by varying the capacitance in the oscillator 600. Varactors 612 can be controlled by a control voltage at input VCTRL to change the capacitance in the tuning network 606 of oscillator 600. Also, the switch for connecting the switched capacitors 614 to the oscillator 600 can be closed to change the capacitance in the oscillator 600.

Figures 9A, 9B:
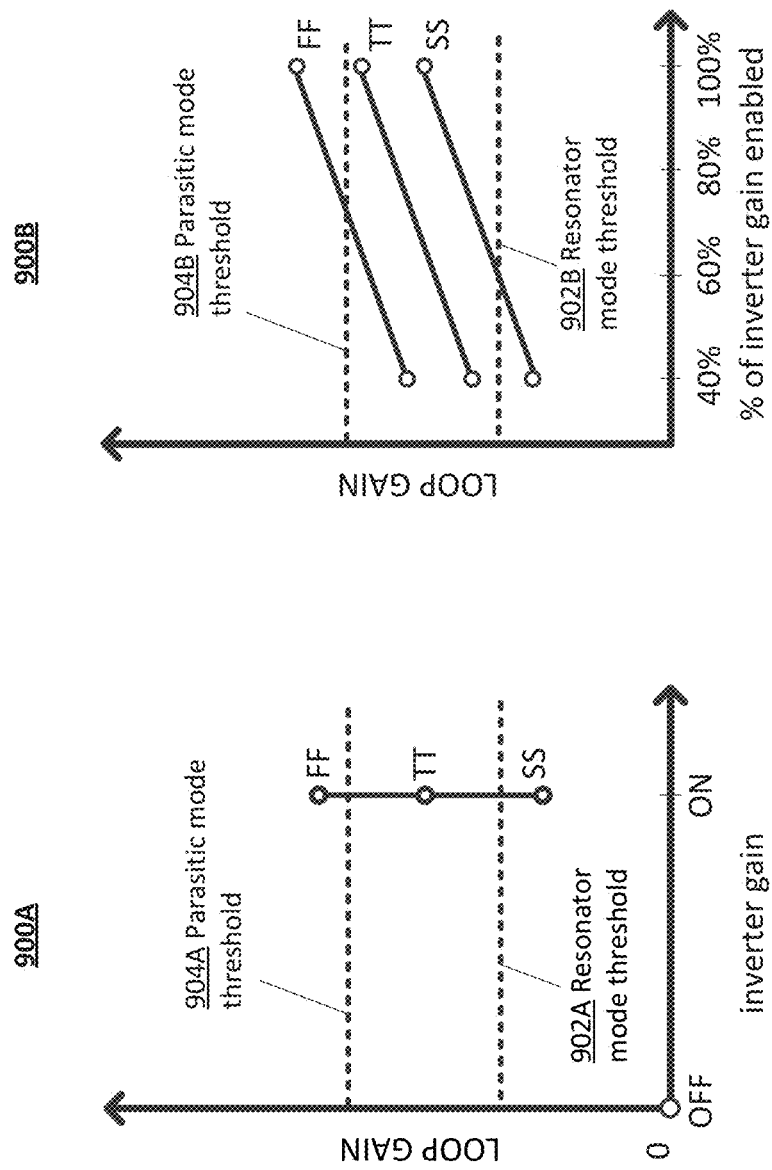
FIGS. 9A and 9B show a plot of loop gain against inverter gain for inverters at different manufacturing process corners where the inverter gain is enabled and disabled, and the inverter gain is selected to be a percentage of the total gain of the inverters, respectively.

FIG. 9A shows loop gain plotted against inverter gain for an inverter at SS, TT, and FF process corners wherein the gain of the inverter is either ON or OFF but cannot be set to other incremental gain values between ON and OFF or higher. FIG. 9B shows loop gain plotted against total inverter gain for an oscillator comprising a programmable inverter similar to the inverter shown in FIG. 7A at SS, TT, and FF process corners in accordance with an embodiment of the present disclosure. Lines 902A and 902B show the lower threshold loop gain amounts required to sustain resonator mode oscillations. Lines 904A and 904B show the upper threshold loop gain amounts above which high-frequency parasitic mode oscillations can start. The x-axes in FIG. 9A and FIG. 9B are representative only and are not necessarily in the same scale. As shown in FIG. 9A, if the inverter is at SS process corner, it may contribute insufficient loop gain to cause oscillations at a resonator mode frequency. Similarly, if the inverter is at FF process corner, it may contribute too much loop gain and trigger oscillations at a high-frequency parasitic mode (a mode caused by package parasitic inductances or explicit inductances 608 added to extend the tuning range) with frequencies higher than the resonator frequency. As shown in FIG. 9B, if the inverter is at SS process corner, in accordance with an embodiment of the present disclosure, the inverter can be started at a fraction of the full gain (40% gain shown here) and incrementally increased to 100% gain. If the inverter is at FF process corner, the inverter can be started at a low gain (again, 40% gain shown here) but only increased up to 60% gain to sustain the resonator oscillation mode while avoiding triggering a high-frequency parasitic oscillation mode.

Figure 10A:
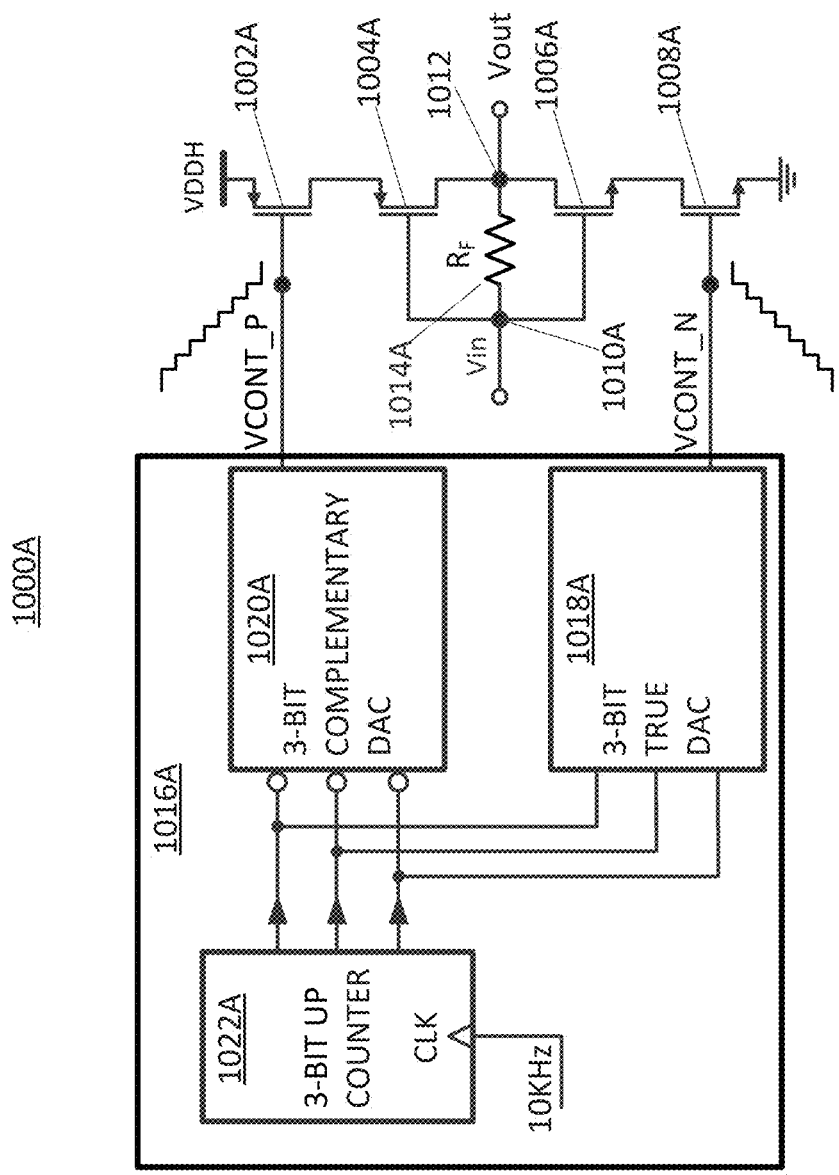
FIG. 10A shows a programmable inverter for use with the oscillator of FIG. 6 in accordance with another embodiment of the present disclosure.

FIG. 10A shows another embodiment of a programmable inverter 1000A, which can be used as the programmable inverter 618 in the oscillator 600 of FIG. 6. The programmable inverter 1000A comprises a pair of PMOS 1004A and NMOS 1006A transistors. The gain contributed by the PMOS 1004A and NMOS 1006A transistors is controlled by resistive switches which can be a second pair of PMOS 1002A and NMOS 1008A transistors which receive, respectively, complementary staircase voltage control signals VCONT_P and VCONT_N from the outputs of two digital-to-analog converters (DACs) 1020A, 1018A. The inverter 1000A also comprises an inverter controller 1016A. In an embodiment, the inverter controller 1016A may be not part of the inverter 1000A but separate therefrom. The inverter controller 1016A may also control multiple inverters, similar to inverter 1000A, at the same time. The inverter controller 1016A comprises a 3-bit up counter 1022A which receives a clock signal and counts from 0 to 7 over a period of time. The 3-bit up counter 1022A is connected to a 3-bit DAC 1018A and a 3-bit complementary DAC 1020A. The 3-bit up counter 1022A provides the DACs 1018A, 1020A with a true digital signal and a complementary (bit-inverted) digital signal, respectively. The DAC 1018A is connected to the VCONT_N input of the NMOS 1008A, and the DAC 1020A is connected to the VCONT_P input of the PMOS 1002A. The DAC 1018A output voltage ramps up over time and increases the gain contributed by the NMOS 1006A transistor, while the complementary DAC 1020A voltage output simultaneously ramps down over time and increases the gain contributed by the PMOS 1004A transistor. The DACs 1018A, 1020A permit fine control over the gain contributed by programmable inverter 1000A.

An embodiment of an oscillator in accordance with the present disclosure may also comprise a process monitor unit. The process monitor unit provides information about the manufacturing process variations on a given semiconductor die, namely, whether the manufactured NMOS/PMOS transistors are fast/fast (FF) or slow/slow (SS) or typical/typical (TT) compared to their expected nominal targets. The process monitor unit extracts data about the process corner of the oscillator core, generally, and the transistors' parameters, specifically, based on reference or replica test circuitry. That data can then be used to determine the amount of gain contributed by the inverters initially to commence the oscillations, and to determine the upper amount of gain contributed by the inverters which may be required for desired oscillations. Limiting the gain to an upper amount which is less than the maximum gain contributable by the inverters helps reduce the amount of power consumed by the oscillator, as well as avoiding oscillation waveform clipping and distortion that could degrade the phase noise. Starting at the correct gain setting required to generate the resonator mode oscillation also helps reduce the start-up time of the oscillator.

Figure 10B:
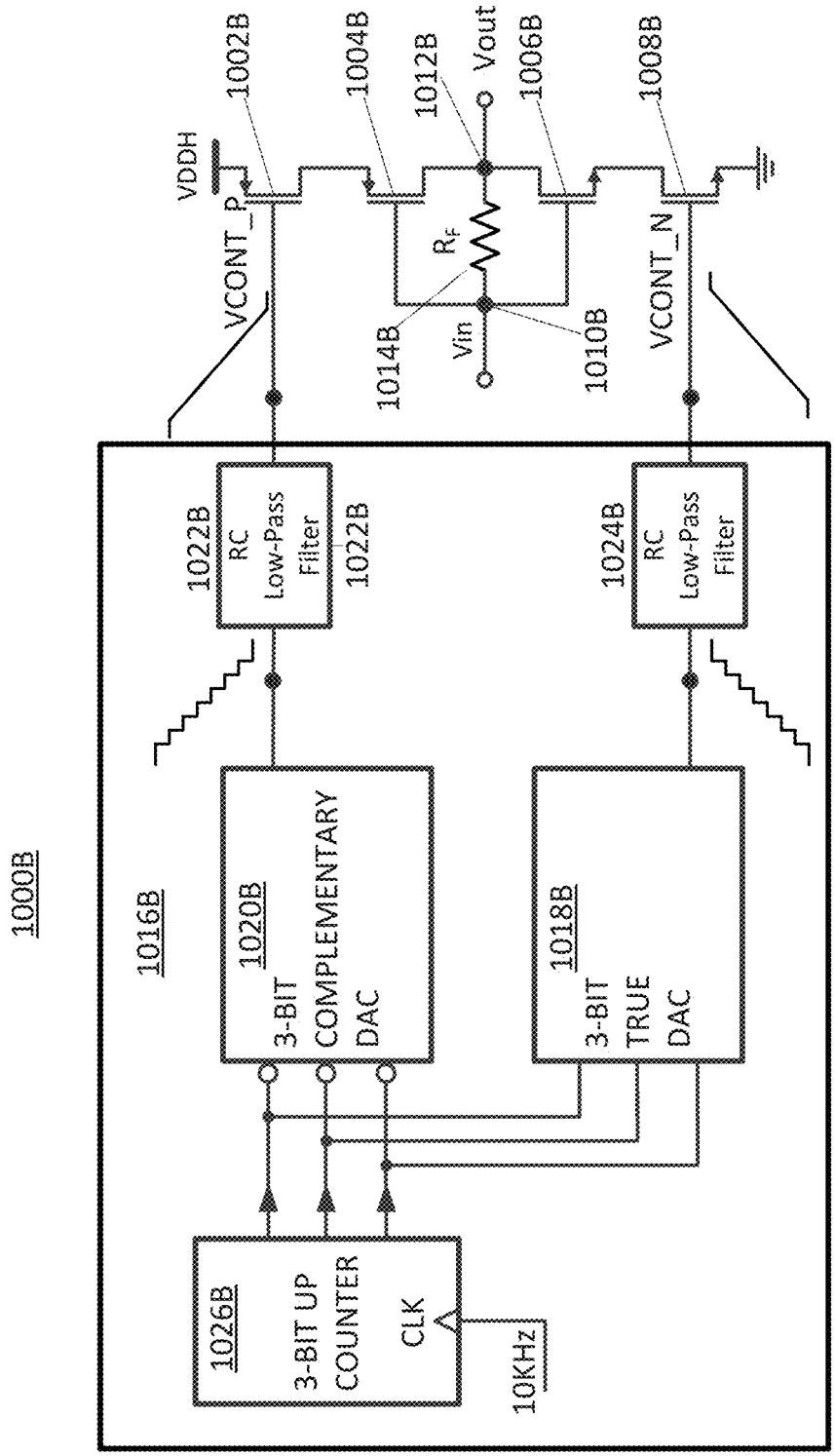
FIG. 10B shows another programmable inverter for use with the oscillator of FIG. 6 in accordance with another embodiment of the present disclosure.

FIG. 10B shows another embodiment of a programmable inverter 1000B which is very similar to inverter 1000A of FIG. 10A, the difference being that the inverter 1000B comprises RC low-pass filters 1022B, 1024B between the outputs of the DACs 1018B, 1020B and the VCONT_P, VCONT_N inputs. The RC low-pass filters 1022B, 1024B smoothen the staircase control voltage signals to create continuous control voltage signals rather than discrete high frequency signals. This causes the inverter to contribute a continuous increase in gain to the oscillations over a period of time.

Figure 11:
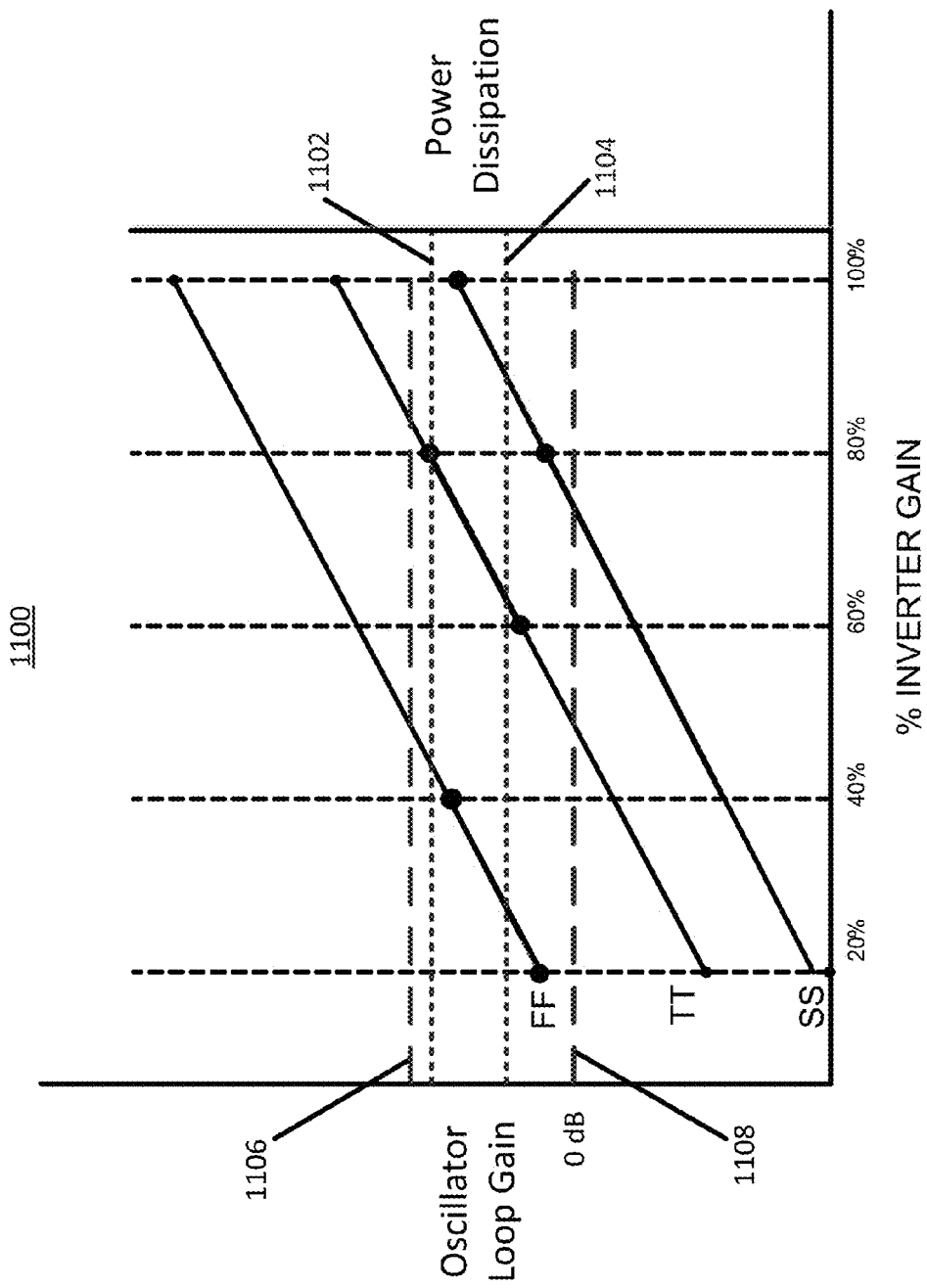
FIG. 11 shows a plot of power dissipation and oscillators loop gain against inverter gain for inverters at different manufacturing process corners.

FIG. 11 shows a plot 1100 of oscillators loop gain and power dissipation versus inverter gain percentage for inverters at FF, TT, and SS process corners. There is an optimum power dissipation upper threshold 1102 and lower threshold 1104 that define a range to achieve acceptable phase noise performance. The process monitor unit helps to identify the manufacturing process corner of a particular inverter to help ensure that the gain contributed by the inverter stays at or below the optimum power dissipation upper threshold 1102. The process monitor unit also helps to ensure that the loop gain contributed by the inverters is at least above 0 dB threshold 1108 for the resonator mode so that oscillations occur, and below an upper gain threshold 1106 to avoid high-frequency parasitic mode oscillations. If the oscillator's loop gain contributed by the inverters is below 0 dB threshold 1108, oscillations may not start or they may start but at an incorrect frequency. If the oscillator's loop gain contributed by the inverters is above the upper threshold 1106, high-frequency parasitic mode oscillations may occur. In plot 1100, to stay within the optimal power dissipation range but still allow oscillations to commence, an inverter at process corner FF would start at 20% gain and increase to a maximum of 40% gain; an inverter at process corner TT would start at 60% gain or lower and increase to a maximum of 80% gain; and an inverter at process corner SS would start at 80% gain or lower and increase to a maximum of 100% gain.

Figure 12:
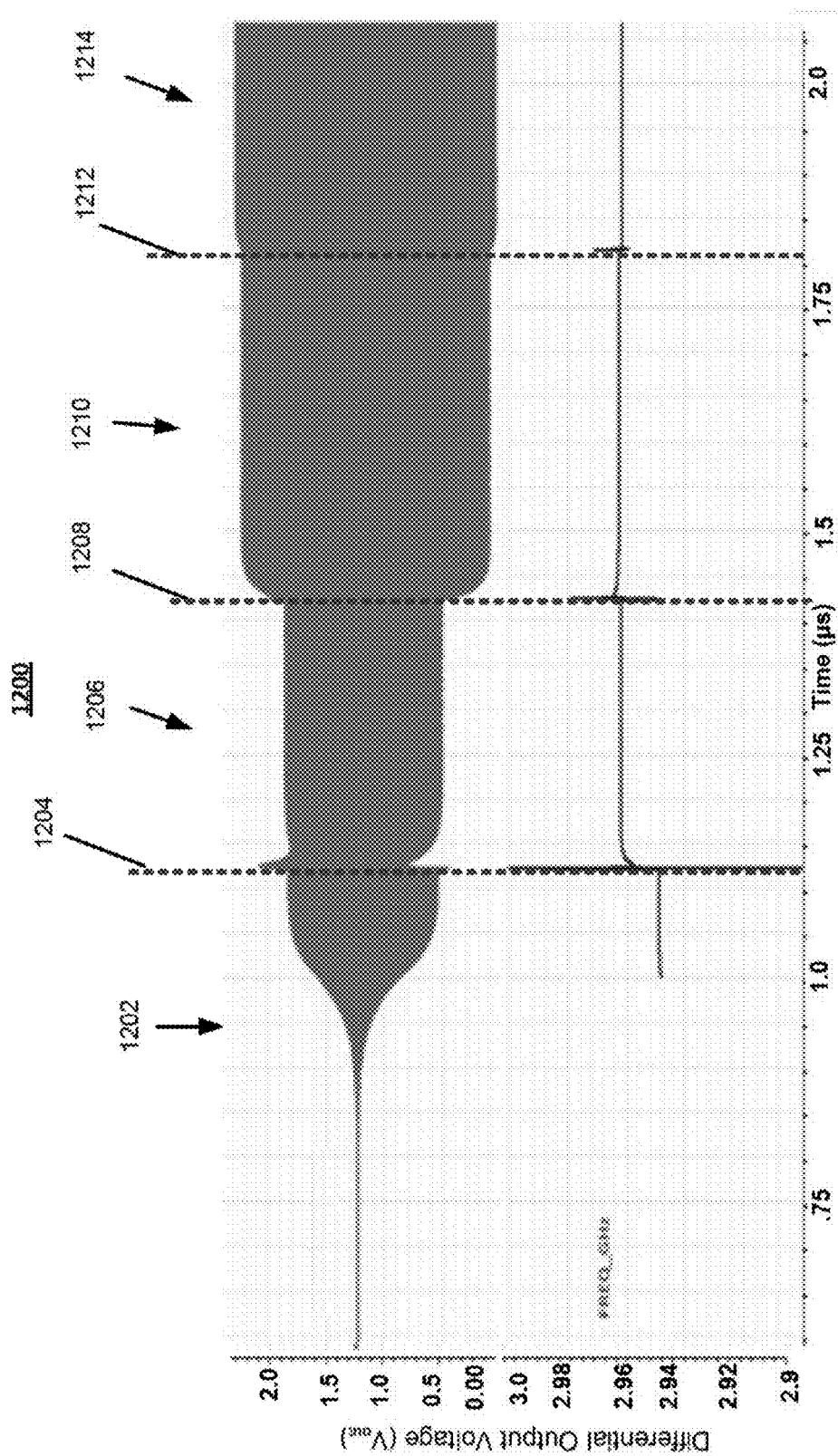
FIG. 12 shows a plot of differential output voltage and frequency over time for oscillations created by the oscillator of FIG. 6 in accordance with an embodiment of the present disclosure.

FIG. 12 shows a plot 1200 of oscillations created by the oscillator 600 of FIG. 6 in accordance with an embodiment of the present disclosure. The y-axis shows the oscillator's differential output voltage $V_{out}$ and the x-axis shows the time in microseconds (μs). To inhibit relaxation oscillations and high-frequency parasitic mode oscillations from occurring, the oscillator 600 follows a start-up sequence. The high-pass filter is enabled when the gain stage is enabled. This causes the oscillator to enter "low-swing" mode 1202, so balanced oscillation will begin to accumulate in the oscillator. The oscillator core is also programmed to contribute only a low amount of gain to the oscillations during start-up to inhibit high-frequency parasitic mode oscillations. Once the oscillations 1202 stabilize, the high-pass filter is disabled at a certain point in time 1204 and the oscillator 600 enters "high-swing" mode 1206, 1210, 1214 for maximum phase noise performance. In this mode, the gain contributed by the oscillator core is slowly increased at certain points in time 1208, 1212. For low-end applications, the oscillator 600 may continue to operate in low-swing mode at steady state and perform the gain increase steps on the low-swing mode to reduce the start-up complexity and time, and remove the need for the switch 628. This assumes that the phase noise performance in the low-swing mode is sufficient for the target application.

FIG. 13A shows a simplified circuit diagram of the oscillator 600 of FIG. 6 at low frequencies (where the resonator is approximated as an open-circuit) and when input HF_EN is disabled and hence the resistors 626 are not connected to the oscillator 600. The oscillator 600 is in single-ended mode. The circuit of FIG. 13A is not a desired configuration when first commencing oscillations in the oscillator 600 and is shown only for the purposes of explanation. At low frequency, the resonator 602 and inductors 608 have no effect on the oscillator 600 because the resonator 602 provides a very high impedance relative to the rest of the oscillator 600, and inductors 608 act nearly as short circuits. In the state illustrated in FIG. 13A, the oscillator 600 is, effectively, a relaxation oscillator. In this state, the frequency of undesired relaxation oscillations in the oscillator 600 is determined by capacitors 622 and the input impedance of the gain stage, which is affected by feedback resistors 620, switched capacitors 614, and varactors 612.

FIG. 13B shows a simplified diagram of the oscillator 600 of FIG. 6 at low frequencies where the resonator is approximated as an open-circuit, when HF_EN is enabled and the resistors 626 are connected to the oscillator 600. Again, the circuit 600 is in single-ended mode. This is a desired configuration when first commencing oscillations in the oscillator 600. The resistors 626 add an extra pair of pole and zero to form a high order high-pass filter with varactors 612, switched capacitors 614, and capacitors 622, and feedback resistor 620. The high-pass filter creates additional low frequency attenuation to suppress the gain at the relaxation frequency without affecting high-frequency gain at the desired oscillation frequency. This inhibits relaxation oscillations from occurring in the oscillator 600. The resistors 626 need to be sufficiently small to suppress relaxation oscillation, but sufficiently large not to attenuate the main oscillations. If the high-pass filter is not turned on during start-up, unwanted relaxation oscillation can occur first. These parasitic oscillations can continue to exist at steady state operation. Depending on the gain at the desired oscillation frequency, the desired oscillation frequency may overcome the relaxation oscillation frequency, or the relaxation oscillation frequency may dominate to prevent the oscillations from reaching the desired frequency.

FIGS. 14A-C show the open loop gain in decibels (dB) versus frequency (GHz) for various configurations of the oscillator 600 of FIG. 6 over time, including when commencing oscillations and a high-pass filter is disabled (an undesired configuration), when the high-pass filter is enabled, and when oscillations have reached the desired frequency after the high-pass filter is disabled and the gain contributed by the inverters is not further increased.

FIG. 14A shows a graph of the open loop gain versus frequency when commencing oscillation in the oscillator 600 as shown in FIG. 6 wherein the high-pass filter is disabled. Disabling the high-pass filter when commencing oscillations is an undesired configuration, and the resulting graph in FIG. 14A is for the purposes of explanation only. Since the loop gain $G_R$ at the relaxation frequency 1402A is higher than 0 dB or unity gain, it is possible for relaxation oscillations to start at this frequency, rather than for desired oscillations to start at the resonator frequency 1404A.

FIG. 14B shows the open loop gain as compared to oscillation frequency when commencing oscillations in the oscillator 600 of FIG. 6 wherein the high-pass filter is enabled. Enabling the high-pass filter when commencing oscillations is a desired configuration. Enabling the high-pass filter during start-up significantly reduces the gain $G_R$ at relaxation frequency 1402B to less than 0 dB or unity gain, which inhibits relaxation oscillations from occurring in the oscillator 600. Since the loop gain $G_F$ at the desired oscillation frequency 1404B is the only point that is higher than 0 dB or unity gain, the oscillation will build up to the desired resonator frequency. Once the steady-state oscillation has been achieved at the desired frequency, the high-pass filter is turned off by the controller to transition the oscillator to high-swing mode and perform the gain ramp-up to boost the oscillator amplitude and achieve lower phase noise.

FIG. 14C shows the open loop gain as compared to oscillation frequency when oscillations have reached the desired frequency and wherein the high-pass filter is disabled and the gain ramp-up is completed. When oscillations reach large-signal steady-state at the desired frequency 1404C, the momentum of the oscillations (triggered in the high-Q electro-mechanical resonator) cause the oscillator to continue to run at the desired frequency 1404C and suppress other possible modes of oscillation. At large-signal steady state, the gain at frequency 1404C is settled to 8 dB or unity gain to sustain the oscillation. If the gain at frequency 1402C is less than 0 dB or unity gain, as depicted, then it is not possible for relaxation oscillations to occur.

An electro-mechanical resonator can be modeled by a lumped RLC circuit. Both 2-port and 1-port models of the lumped RLC circuit can be used to describe the electrical behavior of the resonator. The 1-port model, which is more relevant to oscillator design, is known as Butterworth-Van-Dyke (BVD), or modified BVD (mBVD).

Figure 15:
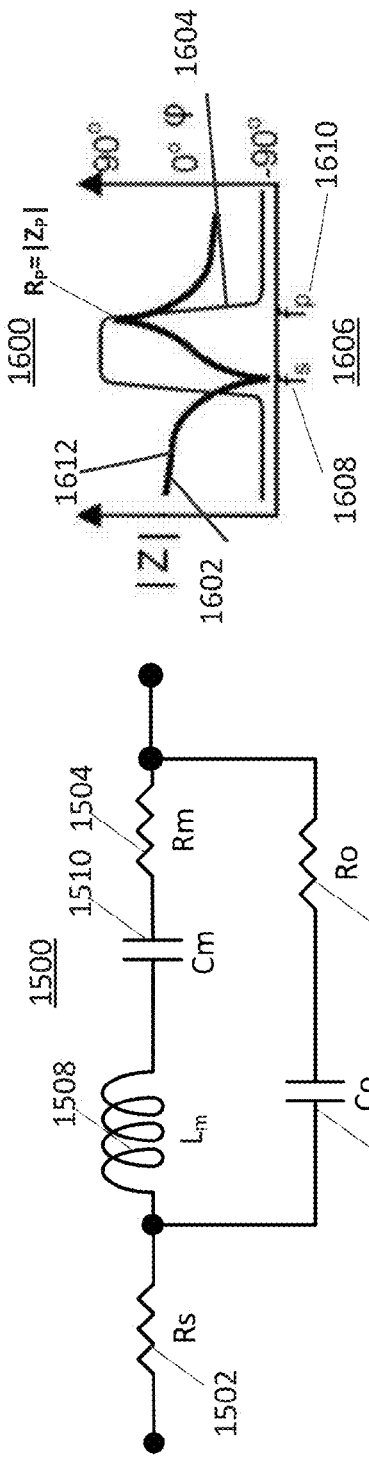
FIG. 15 shows a mBVD model of an electro-mechanical resonator.

FIG. 15 shows an mBVD model 1500 of an electro-mechanical resonator. For multi-gigahertz resonators, the inclusion of the resistances $R_s$, $R_m$, and $R_0$ is to accurately model the resonator losses at the high frequencies they can attain.

Figure 16:
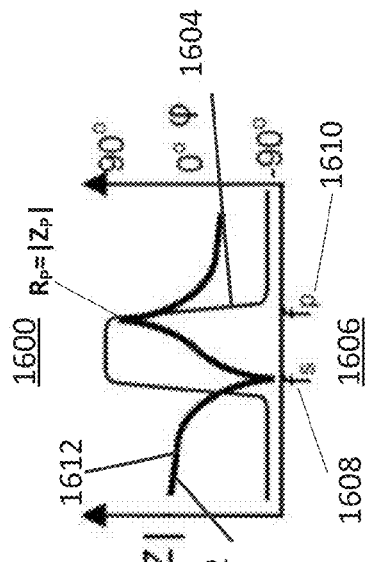
FIG. 16 shows a plot of the impedance magnitude and impedance phase of the modified Butterworth-Van-Dyke (mBVD) model of an electro-mechanical resonator over a range of frequencies.

FIG. 16 shows a plot 1600 of the impedance magnitude (Z) 1602 on a logarithmic scale, and impedance phase ($\phi$) 1604 on a linear scale, of the mBVD model electro-mechanical resonator 1500 of FIG. 15 at various frequencies 1606. Below a series resonance frequency 1608 ($f_s$) and above a parallel resonance frequency, also known as anti-resonance frequency, 1610 ($f_p$), the resonator 1500 exhibits a capacitive behavior, or acts like a capacitor. At DC, the resonator is essentially an open-circuit.

At resonance frequency $f_s$, the series $L_m$-$C_m$ motional branch acts nearly as a short and the resonator exhibits its lowest impedance, which has a purely real part ($\approx R_m + R_s$) with no imaginary part. By comparison, when frequency f approaches infinity, the resonator impedance approaches zero, but the impedance has both real and imaginary parts.

At frequency $f_p$ 1610, the motional branch and the parallel branch co-resonate and the resonator exhibits its highest impedance, which is also purely real. Resistances 1502, 1504, and 1506 model the resonator 1500 losses.

Figure 18A:
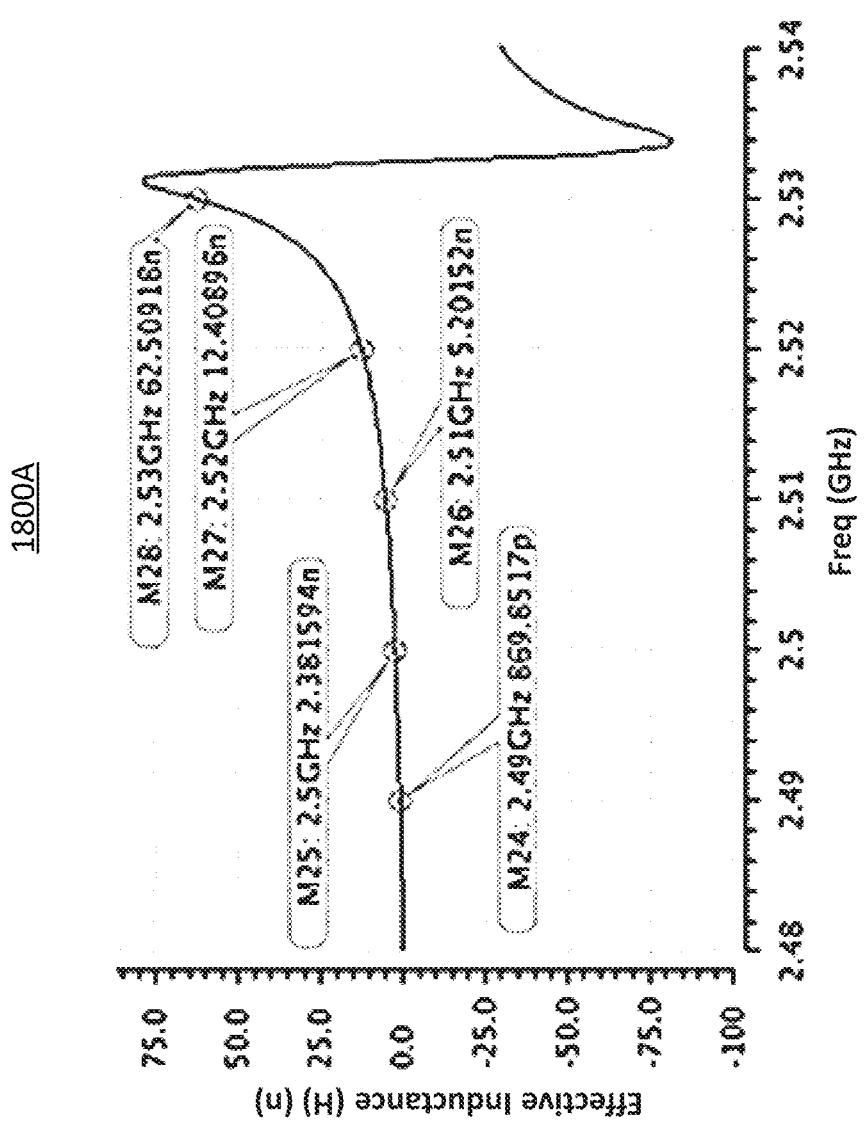
FIGS. 18A and 18B show example plots, in linear and logarithmic scales, respectively, of the effective inductance of a resonator similar to the resonator shown in FIG. 14 in an oscillator similar to the oscillator of FIG. 6.

Between frequencies $f_s$ 1608 and $f_p$ 1610 the resonator exhibits an inductive behavior, or acts like an inductor where the impedance magnitude increases versus frequency. The working frequency band of the resonator in a parallel mode oscillator is, accordingly, between $f_s$ and $f_p$. Therebetween, inductor $L_m$ 1508 dominates in the series branch and the resonator 1500 acts like an inductor with an effective inductance of $L_{eff}$, the plots of which at various frequencies are shown in FIG. 18A in the linear scale, and FIG. 18B in the logarithmic scale.

The frequency response shown in FIG. 16 is in logarithmic scale. It shows a significant change in impedance levels on plot 1602 over a narrow frequency band between frequencies $f_s$ (1608) and $f_p$ (1610), from the absolute minimum to maximum. For example, a typical value of the minimum impedance magnitude at frequency $f_s$ is approximately 1 to 2 ohms and a typical maximum impedance magnitude at frequency $f_p$ is approximately 2 kilo ohms to 6 kilo ohms for a multi-gigahertz FBAR/BAW resonator.

Because the resonator 1500 is only inductive between frequencies $f_s$ and $f_p$, the bandwidth or distance between frequencies $f_s$ and $f_p$ is, effectively, the frequency tuning range of the oscillator. The frequency tuning range (FTR) of a resonator is defined by the formula $(f_p - f_s)/f_s$. Effective coupling ratio $k_{eff}^2$ is related to the FIR, and is defined by the formula $k_{eff}^2 = (f_p^2 - f_s^2)/f_s^2$. The larger the desired FTR, the higher the $k_{eff}^2$ required for the resonator.

FBAR/BAW type resonators have a $k_{eff}^2$ equal to around 4%-6%, which is why such piezoelectric resonators are most suitable for narrowband applications. In between $f_s$ and $f_p$ frequencies, the mBVD model of the resonator 1500 can be simplified to an effective inductance, as well as an effective series resistance that determines the resonance quality factor Q.

Figure 17:
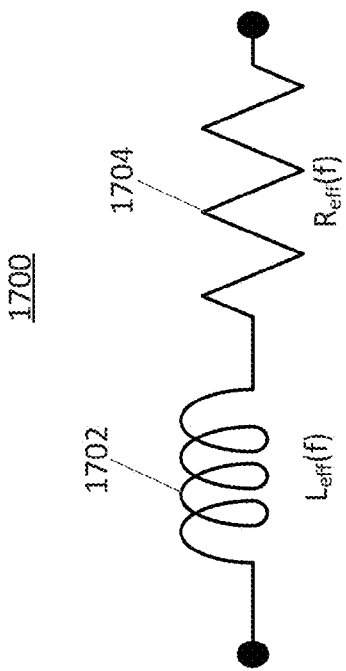
FIG. 17 shows a simplified circuit diagram of the mBVD model of FIG. 14.

FIG. 17 shows a simplified circuit diagram 1700 of the mBVD model 1500 of FIG. 15 when operating between $f_s$ and $f_p$. The effective inductance $L_{eff}(f)$ 1702 is in series with an effective resistance $R_{eff}(f)$ 1704 where f is the frequency variable. Above $f_s$, the inductance from inductor $L_m$ 1508 dominates in the series branch and the resonator 1500 exhibits an inductive behavior, or acts like an inductor. At frequency $f_p$, the series branch impedance resonates with the parallel capacitor $C_o$ 1512 branch, hence the resonator 1500 reaches its highest impedance. The working band of the resonator 1500 in parallel with the oscillator is therefore between $f_s$ and $f_p$.

Figure 18B:
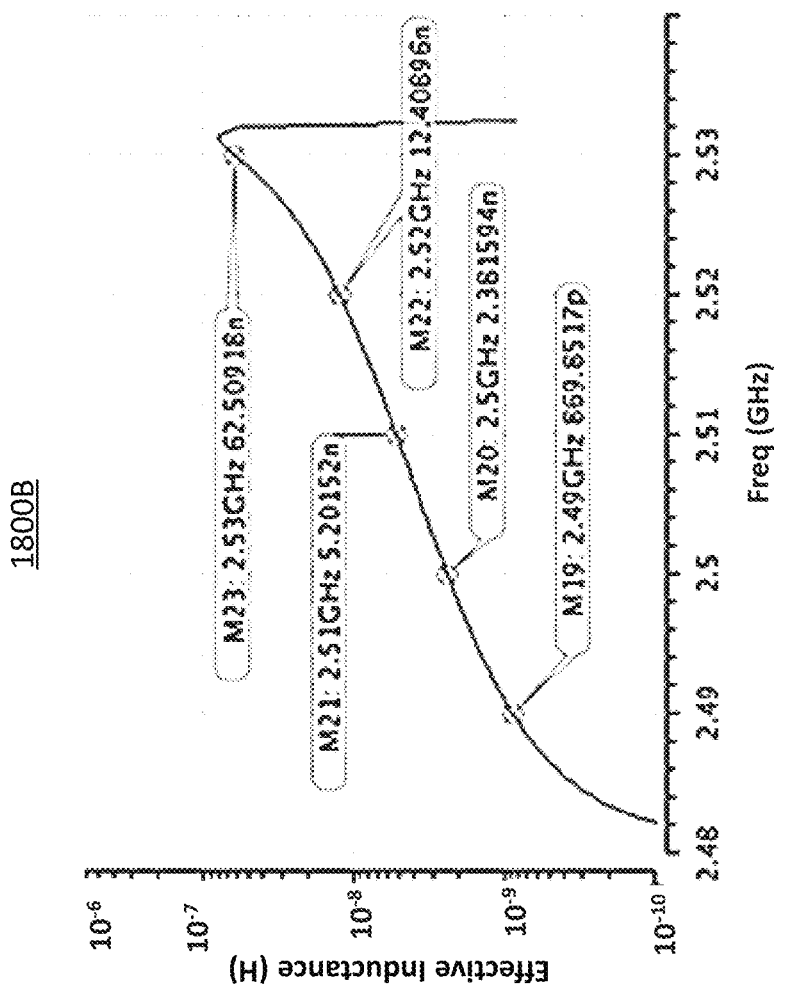

FIGS. 18A and 18B show example plots of the effective inductance of the mBVD model 1500 of a resonator shown in FIG. 15, in an oscillator similar to the oscillator 600 of FIG. 6, but without inductors $L_1$ 608, across a range of frequencies on a normal 1800A and logarithmic scale 1800B, respectively. As shown, the effective inductance changes significantly across the working range of frequencies. The oscillation frequency $f_0$ is determined by the amount of capacitance resonating with the effective inductance $L_{eff}$ of the resonator, and can be described by the equation $$f_0 = \frac{1}{2\pi\sqrt{L_{eff} C_{total}}}$$

The effective inductance of the resonator increases exponentially with frequency. Between the frequencies $f_s$ and $f_p$, the effective inductance $L_{eff}$ can be approximated by the equation $\log(L_{eff}) \approx kf + n_0$, where k and $n_0$ are constants. The capacitance required for oscillation at a particular frequency is then derived according to the proportional relationship $$C \propto \frac{1}{f^2 10^{kf}}.$$

This relationship essentially implies that to linearly change the frequency of the oscillations in the oscillator, an exponential change in capacitance in the oscillator's resonant tank is required.

Greater changes in capacitance, however, require a larger capacitor to facilitate a large relative change in capacitance ($C_{MAX}/C_{MIN}$ ratio), which would in turn lead to a larger semiconductor die area and, potentially, a larger IC package size. Accordingly, it is desirable to keep the maximum amount of capacitance required to a minimum. This can be difficult to do, however, because of parasitic capacitance, which is always present in the oscillator, and imperfect switches for controlling the capacitor bank. Large capacitors require large (low-resistance) electronic switches to connect the capacitance to the circuit, and this relationship is fixed in order to maintain a good Q factor. This, however, makes it difficult to get a large relative change in capacitance ($C_{MAX}/C_{MIN}$ ratio) to tune the frequency of the oscillator since the larger the switch, the greater the parasitic capacitance, and this would increase $C_{MIN}$ in the denominator. As such, the large parasitic capacitance restricts the $C_{MAX}/C_{MIN}$ ratio of the switchable capacitor, thereby limiting the frequency tuning range.

FIG. 19 shows a capacitor bank 1900 comprising varactors 1902 and switched capacitors 1904 similar to the varactors 612 and switched capacitors 614 of oscillator 600 of FIG. 6, respectively. The varactors 1902 and switched capacitors 1904 are arranged in parallel with one another. The switched capacitors 1904 are enabled or connected by electronic switches 1906. The switched capacitors 1904 may be metal-oxide-metal (MoM) or metal-insulator-metal (MiM) capacitors or any other types of fixed capacitors.

FIG. 20 shows a representation of an individual branch 2000 of the switchable capacitor 1904 of FIG. 19. Capacitors $C_{Bi1}$ 2002 represent the top plate parasitics of the switchable capacitor 1904, and capacitors $C_{Bi2}$ 2004 represent the bottom plate parasitic capacitance including other parasitic capacitances from the switch 1906. The switch itself has a small ON resistance (not shown). When the switch 2006 is closed, the branch capacitance is close to $C_{Mi}/2$, where $C_{Mi}$ 2008 is the main switchable capacitance element. But when the switch 1906 is open, instead of having an open circuit, the branch has an OFF capacitance of $$\left(\frac{C_{Mi}C_{Bi2}}{C_{Mi}+C_{Bi2}}+C_{Bi1}\right)/2.$$

Bound by practical physical implementation properties, the parasitic capacitances $C_{Bi1}$ 2002 and $C_{Bi2}$ 2004 are proportional to a fraction of $C_{Mi}$ 2008 and set a maximum bound on the max-to-min (on-to-off) capacitance ratio of the capacitor bank 1900.

As an example, in a typical 65 nm CMOS technology, a max-to-min capacitance ratio of 6-to-1, with an acceptable Q in high-performance oscillator applications, can be achieved with switchable MoM capacitors. Although this ratio is usually acceptable in LC oscillator applications, it is in most practical cases too low for tuning electro-mechanical resonators and it would limit the amount by which the frequency of these oscillators could be tuned. A large tuning range is desired to compensate for resonator's manufacturing trim accuracy, aging-induced frequency drift, and temperature-induced frequency drift.

Referring again to FIG. 6, the frequency tuning network 606 comprises two inductors $L_1$ 608, each inductor 608 connected in series with the resonator 602, and varactors 612 and switchable capacitors 614 connected in parallel. The inductors 608 help extend the tuning range of the oscillator 600. The effective inductance of the resonator 602 in series with inductors 608 is described by the equation $L_{eff\_new}=2L_1+L_{eff}$, where $L_{eff}$ is the effective inductance of the standalone resonator, and $L_{eff\_new}$ is the new effective inductance of the resonator together with the inductors $L_1$ in series.

Figure 21:
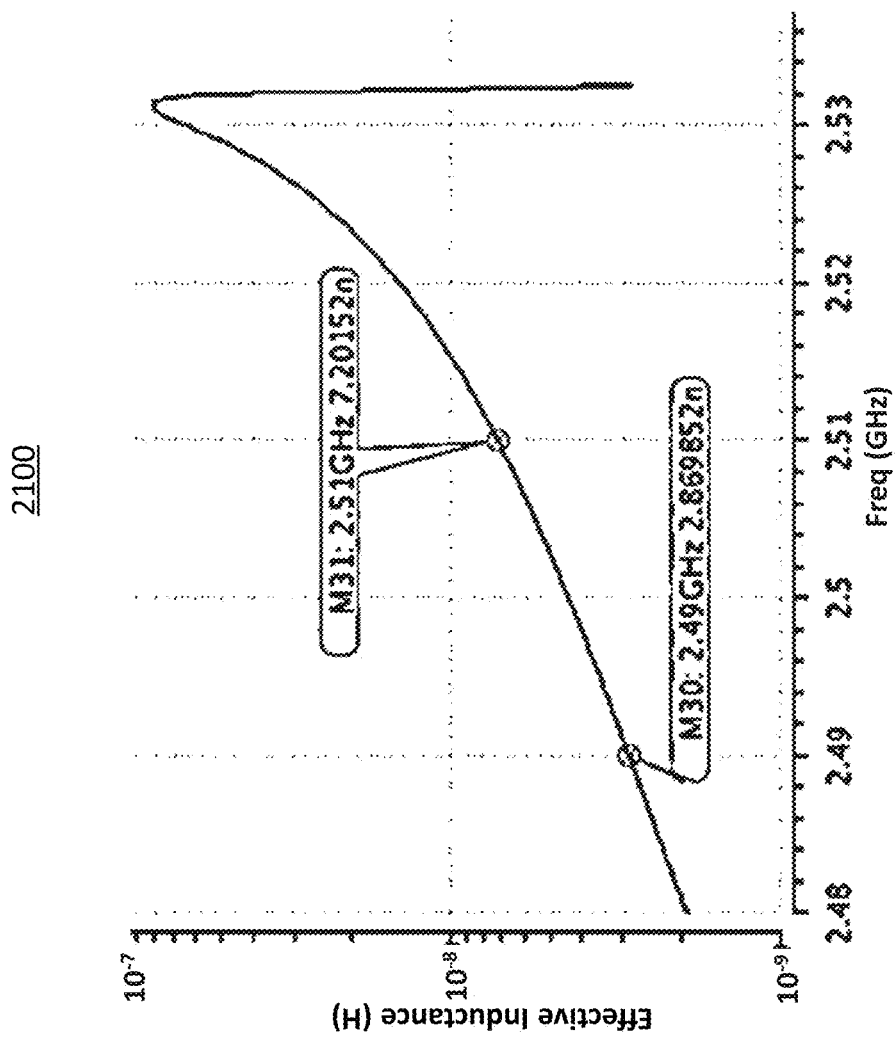
FIG. 21 shows a plot of effective inductance versus frequency of an electro-mechanical resonator, the resonator comprising two series inductors, in an oscillator.

As shown in FIG. 21, the fixed inductance $2L_1$ reduces the logarithmic slope of the effective inductance plot shown in FIG. 18B by significantly increasing the inductance at low end of oscillation frequencies near $f_s$. This makes the resonator tank less dependent on the inverse exponential change in capacitance to achieve a linear change in frequency. The overall capacitance C required for resonant oscillation at f with the resonator plus $2L_1$ can be described by the proportional relationship $$\propto \frac{1}{f^2(2L_1+10^{kf+n_0})},$$

where f is frequency, and k and $n_0$ are constants.

The required capacitance ratio between the oscillator 600 with inductors $L_1$ 608 and the oscillator without the inductors can be described by the equation $$\frac{C_{withL1}}{C_{withoutL1}}=\frac{10^{kf+n_0}}{2L_1+10^{kf+n_0}}.$$

At higher oscillation frequencies near $f_p$, where the capacitance of the oscillator 600 is set at a minimum, the amount of capacitance $C_{MIN}$ needed is roughly the same with or without the inductors $L_1$ 608, and the above ratio is close to 1. At a lower oscillation frequency near $f_s$, however, where the capacitance of the oscillator 600 is set at a maximum, the amount of capacitance $C_{MAX}$ needed to achieve a particular frequency is reduced by virtue of adding the inductors $L_1$ 608 as compared to the oscillator without the inductors. Accordingly, this reduces the max-to-min capacitance ratio ($C_{MAX}/C_{MIN}$) needed to cover the same oscillation frequency tuning range. In other words, the inductors help achieve a desired tuning range for the oscillator 600, but with a smaller on-to-off capacitance ratio.

Referring again to the example discussed in relation to FIG. 18B, a capacitance of 4697 fF is required for the oscillator 600 to create oscillations at a frequency of 2.49 GHz, and a capacitance of 773 fF is required to create oscillations at a frequency of 2.51 GHz. If the oscillator core 604 has a fixed parasitic capacitance of 200 fF, the capacitor bank 612, 614 would require a maximum capacitance of 4497 fF and a minimum capacitance of 573 fF. The max-to-min capacitance ratio would, accordingly, be 7.8, which is difficult to reliably implement in a standard CMOS 65 nm technology due to process variations and unavoidable parasitic capacitances.

FIG. 21 shows a logarithmic plot of effective inductance versus frequency for an oscillator similar to the resonator and oscillator used to obtain the plot in FIG. 18B, the difference being the oscillator comprises two inductors $L_1$, each having an inductance value of 1 nH, in series with its resonator. The capacitance required to oscillate at 2.49 GHz is 1424 fF and at 2.51 GHz is 558 fF. If the fixed parasitic capacitance is 200 fF, the capacitor bank would need a maximum capacitance of 1224 fF and a minimum capacitance of 358 fF, hence a max-to-min ratio of only 3.4. Not only is this capacitance ratio more easily implemented in the 65 nm CMOS technology, but the total amount of capacitance needed has also dropped from 4497 fF to 1424 fF, which can significantly reduce die area and cost to implement the capacitor.

Figure 22A:
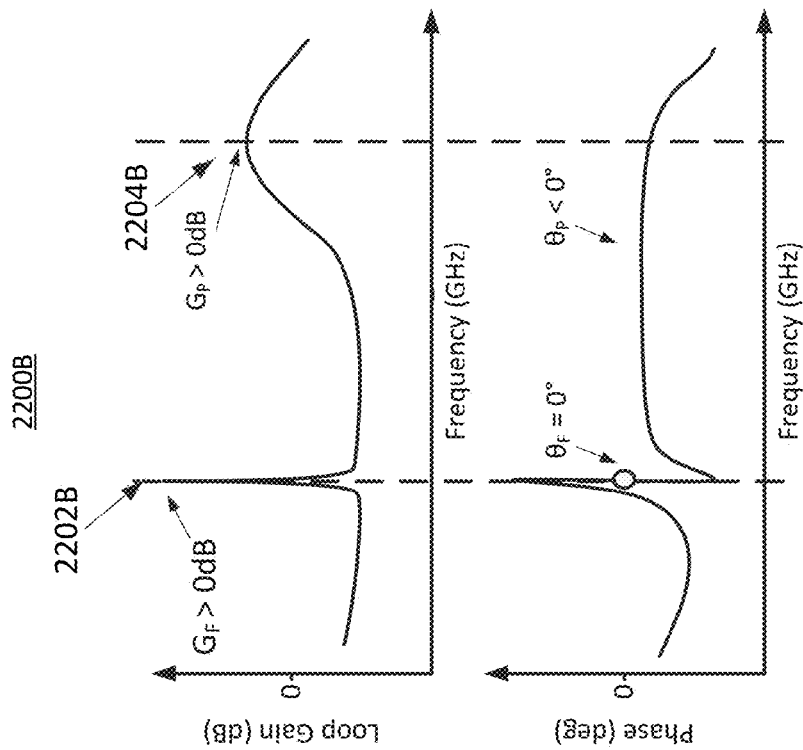
FIGS. 22A and 22B show plots of loop gain and phase for a range of frequencies for an oscillator similar to the oscillator of FIG. 6.

FIG. 22A shows a plot 2200A of the open loop gain in decibels (dB) and phase in degrees for a range of frequencies, for an oscillator similar to the oscillator at start up of FIG. 6 without resistors R1 616. At very high frequencies well above $f_p$, the inductors $L_1$ 608 may introduce a secondary series resonance in the oscillator 600. This is because at frequencies above $f_p$, the resonator 602 exhibits a capacitive behavior, with the capacitance value close to $C_O$ 1512 of the mBVD model 1500 of FIG. 15. This forms a series resonance 2204A with the inductors $L_1$ 608. If the oscillator's open loop gain $G_P$ at the frequency corresponding to parasitic resonance 2204A is higher than 0 dB or unity gain when the phase $\theta_P$ is equal to 0 degrees, the loop can begin oscillating in this parasitic mode. Resistors $R_1$ 616 increase the phase delay at high frequencies to prevent $\theta_P$ from crossing the 0° point, where $G_P$ can be higher than 0 dB. Because Barkhausen criterion for an oscillation to start requires that both θ=0° and G>0 dB, the low-pass filtering action in the phase domain from $R_1$ 616 help prevent any oscillation from occurring at this secondary parasitic frequency.

Figure 22B:
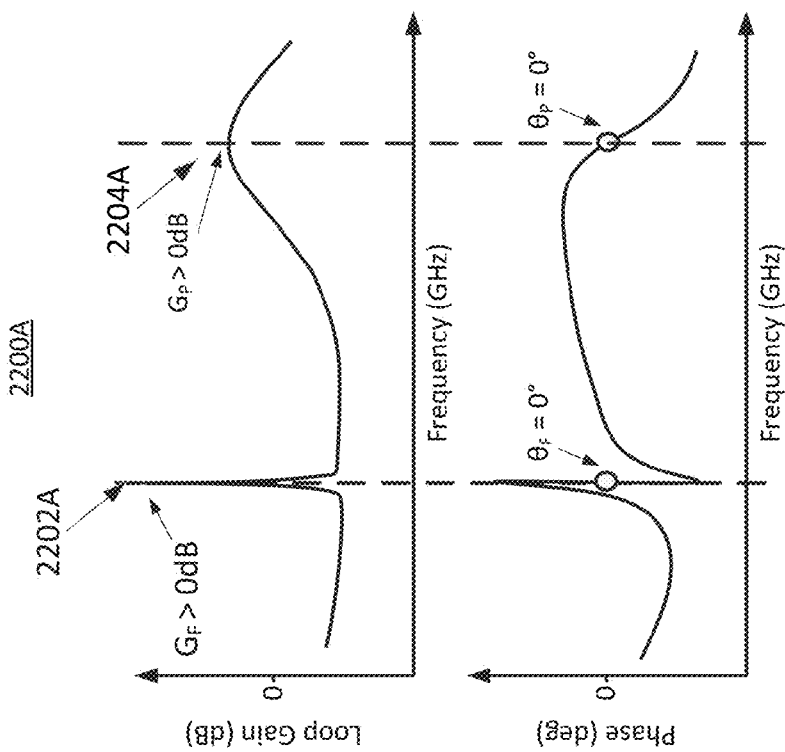

FIG. 22B shows a plot of the loop gain in decibels (dB) and phase in degrees for a range of frequencies, for an oscillator similar to the oscillator of FIG. 6 at start-up but with resistors R1 616. The gain and phase of the loop, $G_F$ and $\theta_F$, for the main oscillation are unaffected, while $\theta_P$ is always kept less than 0° beyond the main oscillation frequency 2202B, including the secondary parasitic frequency 2204B.

Figure 23:
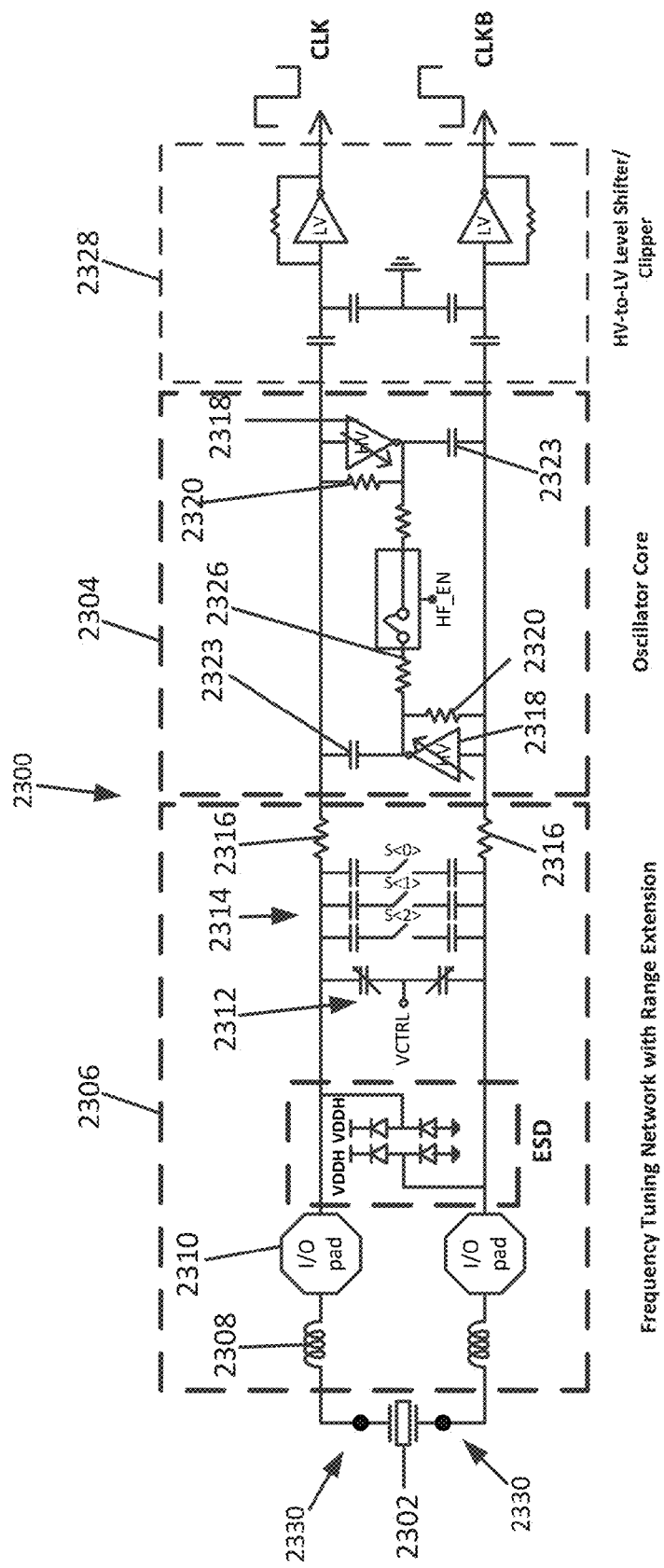
FIG. 23 shows another embodiment of an oscillator in accordance with the present disclosure.

FIG. 23 shows another embodiment of an oscillator 2300 in accordance with the present disclosure. The oscillator 2300 is similar to the oscillator 600 of FIG. 6, the difference being the oscillator 2300 comprises a level shifter 2328 connected to the oscillator driver 2304 to level shift the oscillator output signal from a high-voltage (2.5V) rail to a low-voltage (1.0V) rail. A level shifter 2328 is also known as a hard-limiting amplifier. The embodiment of the oscillator 2300 shown in FIG. 23 produces a square-wave digital signal. The oscillator 2300 may be used in, for example, a high performance clock synthesizer (local oscillator or LO) with an integrated jitter attenuator (JAT) PLL that generates low-jitter, low-phase-noise clock outputs for driving high performance data converters, RF synthesizers, serializers-deserializers (SERDES), and digital signal processing (DSP) subsystems. The oscillator driver 2304 may be fabricated in 65 nm CMOS process using 1-Volt and internal regulated 2.5-Volt power supplies, and Deep-NWell option for noise isolation. Rather than a level shifter 2328, the oscillator 2300 can comprise a band-pass or a tuned amplifier for generating a sinusoidal signal.

Figures 24, 25:
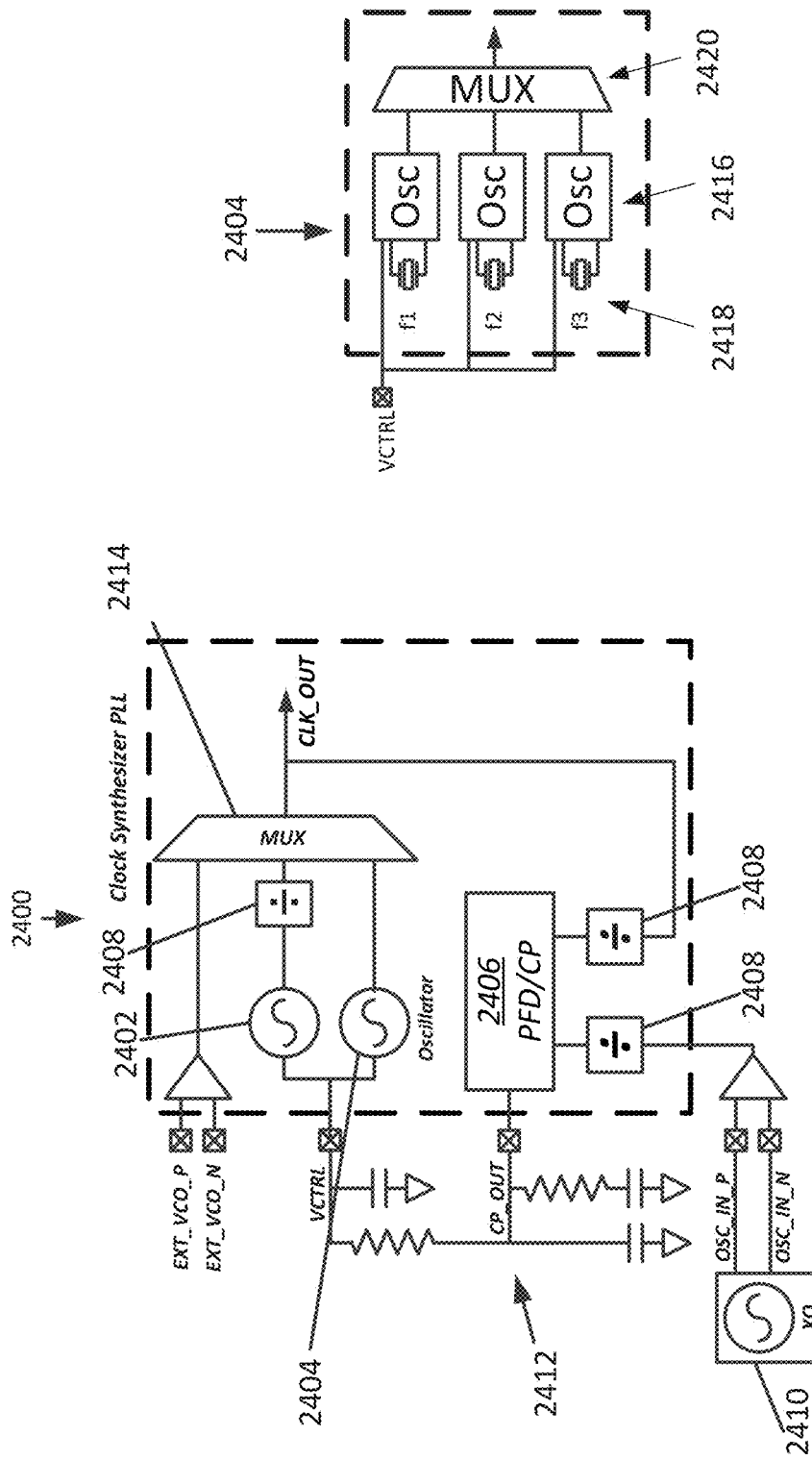
FIG. 24 shows a clock synthesizer phase-locked loop (PLL) comprising a voltage controlled oscillator in accordance with an embodiment of the present disclosure.
FIG. 25 shows a detailed view of a voltage controlled oscillator array of FIG. 23.

FIG. 24 shows a clock synthesizer phase-locked loop 2400 (PLL) comprising first 2402 and second 2404 voltage controlled oscillators. The PLL 2400 also comprises a phase-frequency detector and charge pump 2406 (PFD/CP) and clock dividers 2408. The PLL 2400 receives a reference clock signal from a crystal oscillator XO 2410. The PLL 2400 divides the reference clock signal and compares its phase and frequency to the divided-down output signal CLK_OUT using the PFD/CP 2406. A difference in the phase or frequency generates an output charge-pump signal CP_OUT. The output signal from the PFD/CP 2406 is received by a loop filter 2412. The loop filter 2412 generates a control voltage signal VCTRL. The control voltage signal VCTRL passes into the VCOs 2402, 2404. The first VCO 2402 can be a conventional VCO with an integrated LC resonator followed by a frequency divider. For applications that do not require an ultra low phase noise clock signal, a divided down signal from the first VCO 2402 is selected using a multiplexor 2414. For applications requiring a clock signal with ultra low phase noise performance, the second VCO 2404, which is electro-mechanical based, is selected using the multiplexor 2414. The output signal CLK_OUT from the multiplexor 2414 is the clock signal.

FIG. 25 shows, in greater detail, the second voltage controlled oscillator 2404 of FIG. 24. The voltage controlled oscillator 2404 comprises three tunable electro-mechanical balanced oscillators 2416 in accordance with an embodiment of the present disclosure. In another embodiment, there is a bank of selectable oscillators some of which may be tunable. Each oscillator 2416 comprises an electro-mechanical resonator 2418 centered at a different oscillation frequency f1, f2, f3. The resonators 2418 are BAW or FBAR in miniature hermetic packages incorporated in a flip-chip (FC) or wire-bond (WB) package of the clock synthesizer integrated circuit. The oscillators are connected to a multiplexor 2420, which selects which of the oscillator signals is propagated to an output. The oscillator 2416 with the most suitable frequency for the application and output frequency is selected.

Referring again to FIG. 24, the control voltage signal VCTRL continuously tunes the frequency of the selected oscillator 2402, 2404 so that a precise output frequency is generated that is unaffected by voltage and temperature drifts. The fixed capacitance in the capacitor bank is adjusted (trimmed) in the IC production to offset the production trimming inaccuracy of the resonators 2418.

Variations caused by manufacturing process inaccuracies on NMOS/PMOS transistors can result in variations in gain in oscillator driver stages at typical/typical (TT), fast/fast (FF), or slow/slow (SS) manufacturing process corners. Moreover, the peak impedance value ($R_P$) of the resonator at anti-resonance frequency $f_P$ can vary by a ratio of 2 to 1, or higher. Also, temperature changes and degradation due to time can cause variations in the amount of gain output by a gain stage (inverter). A high-pass filter comprising resistors (such as $R_1$ 616 in FIG. 6) in series with the resonator and the oscillator core may not inhibit parasitic mode oscillations for all inverter process corners. Too large of a resistor value degrades the phase noise in low-$R_P$, and in low drive strength cases at SS process corner, and can also prevent the oscillator from oscillating in corner cases. Too small of a resistor value can allow high-frequency parasitic/package mode oscillations in high-$R_P$ and in high drive strength cases at FF process corner. Accordingly, the value of the series resistor 616 would need to be selected to balance phase noise performance with the possibility of permitting incorrect oscillations. Although a programmable resistor, in place of the fixed resistor, could help compensate for the process corners during run-time, a programmable resistor would require large switches which would potentially degrade the phase noise of the resonator. In accordance with an embodiment of the present disclosure, the need to select the appropriate value of the resistor is avoided by instead injecting oscillations into the oscillator at close to the resonator mode frequency to avoid unwanted oscillation modes. This method permits the value of the series resistor to be significantly reduced or, in some cases, entirely eliminated, which improves phase noise while ensuring correct mode of oscillations.

Figure 26:
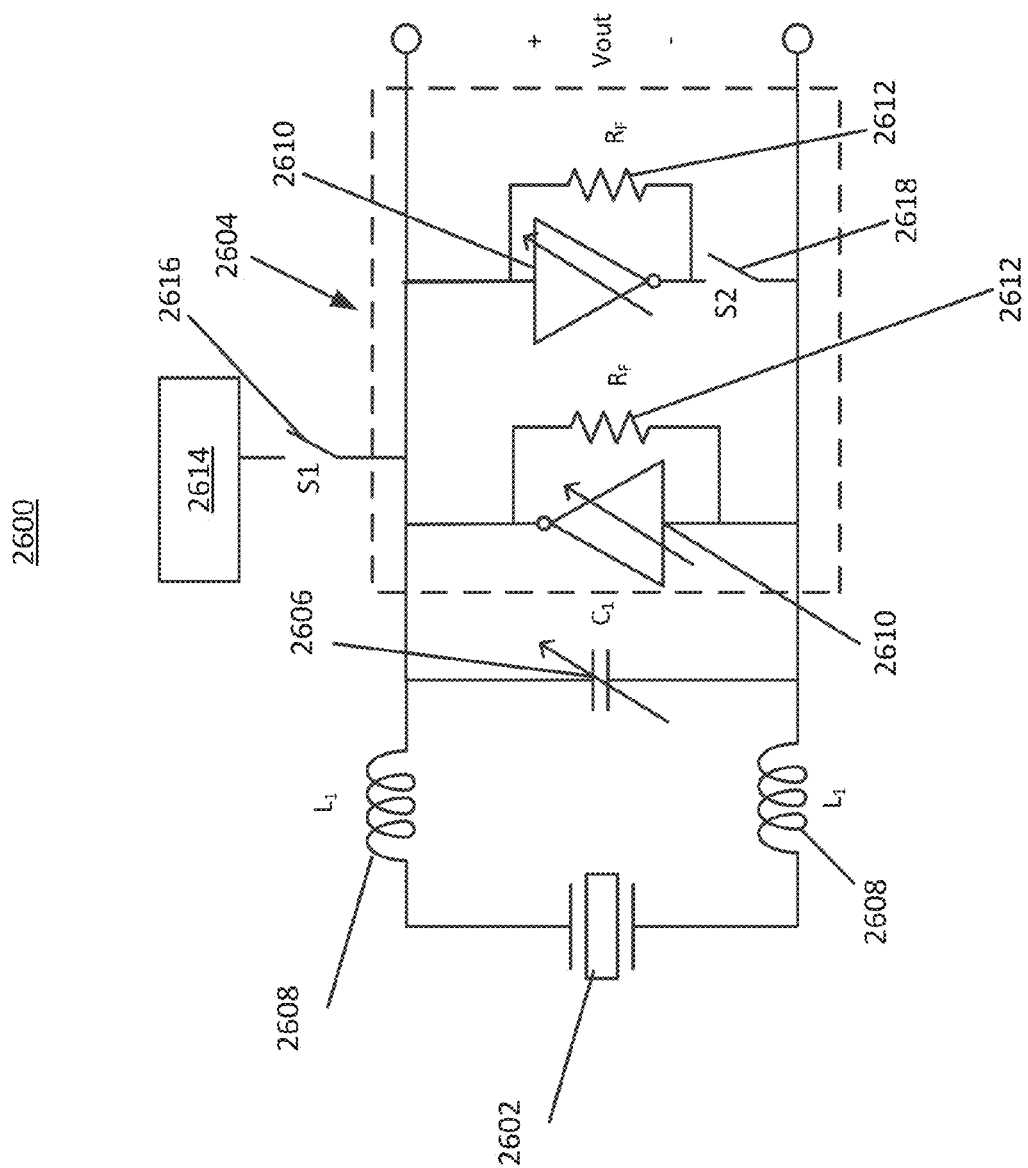
FIG. 26 shows an oscillator comprising an auxiliary clock source which injects oscillations into the oscillator core in accordance with another embodiment of the present disclosure.

FIG. 26 shows a cross-coupled complementary voltage-controlled oscillator 2600 in accordance with another embodiment of the present disclosure. The oscillator 2600 comprises an electro-mechanical resonator 2602 connected in parallel with an oscillator core 2604 and a frequency tuning network 2606 with series inductors 2608, the series inductors to help extend the tuning range of the oscillator 2600 as explained earlier. The frequency tuning network 2606 may comprise a variable capacitor.

In an embodiment of the present disclosure, the oscillator 2600 comprises a resonator input. The resonator input may be any electrical connection capable of receiving, so as being connected to, the resonator 2602. The resonator input is for connecting the resonator 2602 to the other elements of the oscillator 2600. The resonator input receives a signal from the resonator which is communicated to, and used by, the other elements in the oscillator 2600 to create and tune the oscillations.

The oscillator core 2604 comprises two cross-coupled complementary inverters 2610, each inverter 2610 in parallel with a self-biasing negative feedback resistor 2612. The inverters 2610 are DC coupled to the resonator 2602. In an embodiment, the inverters 2610 may have capacitors at their outputs so they are not DC coupled but rather alternating current (AC) coupled. The oscillator 2600 also comprises a clock source 2614 connected by a first switch 2616 (S1) to the oscillator core 2604. The output of the other inverter 2610 is connected by a second switch 2618 (S2) to the resonator. In an embodiment, both inverters 2610 may be connected directly to the oscillator without a switch. Switches 2616 (S1) and 2618 (S2) may be driven by complementary control signals such that when switch 2616 S1 is closed, switch 2618 S2 is open, and vice versa. Switches 2616 (S1) and 2618 (S2) may be driven by skewed complementary control signals having an intentional delay between their transition points such that the switches 2616, 2618 may be both open or both closed for a period of time. The clock source 2614 may be any circuit which generates a clock signal or oscillations with a frequency close to that of the desired resonator mode. The clock source may be inexpensive, and the clock signal may be inaccurate, imprecise and noisy.

When oscillations first commence in the oscillator 2600, the oscillator 2600 operates in single-ended mode by opening the second switch 2618. The first switch 2616 is closed so that the clock source 2614 provides or injects the oscillator core 2604 with oscillations that are close to the resonator mode frequency. During this time, the oscillator 2600 operates in injection mode. The injected oscillations from the clock source 2614 energize or excite the oscillator core 2604 to oscillate close to the resonator mode frequency. This helps avoid the various types of unwanted oscillation frequencies or modes from starting, including high-frequency package parasitic mode, resonator overtones (harmonics), and low-frequency relaxation mode oscillations associated with starting oscillations in a differential oscillator comprising DC-blocking capacitors and an electro-mechanical resonator.

Once oscillations in the oscillator 2600 reach a steady state, the first switch 2616 is opened to disconnect the clock source 2614 from the oscillator 2600. This transitions the oscillator from injection mode to autonomous resonator mode. Since oscillations are already occurring at close to the resonator mode frequency, any oscillations at unwanted frequencies will be suppressed and the oscillator operates in single-ended mode at a frequency determined by the resonator. Once oscillations are stabilized at dose to the resonator mode frequency, the second switch 2618 may be closed to transition the oscillator 2600 from single-ended mode to differential mode. Where the inverters 2610 are DC coupled, there may be a longer wait time between opening the first switch 2616 and closing the second switch 2618 to avoid latching to a non-oscillatory DC stable state. Where the inverters 2610 are alternating current (AC) coupled, the wait time between opening the first switch 2614 and closing the second switch 2618 may be relatively short since the oscillations are already triggered by the clock source 2614, and have reached steady state amplitude, hence there is no possibility of latching to the non-oscillatory DC states.

In addition to avoiding unwanted oscillation modes, injecting oscillations to cause the oscillator 2600 to lock to the resonator mode frequencies helps reduce the amount of time required for the oscillator 2600 to start and achieve steady-state oscillations. A high-Q electro-mechanical resonator would otherwise require a longer oscillation startup time.

In another embodiment, where switch 2618 (S2) is replaced by a short circuit such that the oscillator 2600 comprises two hard-wired back-to-back inverters so as to always operate in differential mode, oscillations from the clock source 2614 are injected through switch 2616 (S1) into the oscillator 2600 during start-up. This causes the oscillator 2600 to produce differential mode oscillations. Here, the clock source 2614 outputs oscillations at a high-energy to overcome the strong loop gain of the back-to-back inverters 2610 and inhibit them from latching up to a non-oscillatory DC state. The oscillator 2600 may be transitioned from injection mode to resonator mode when oscillations reach a steady state by opening switch 2616 (S1), thus disconnecting the clock source 2614 from the oscillator core 2604.

Figure 27:
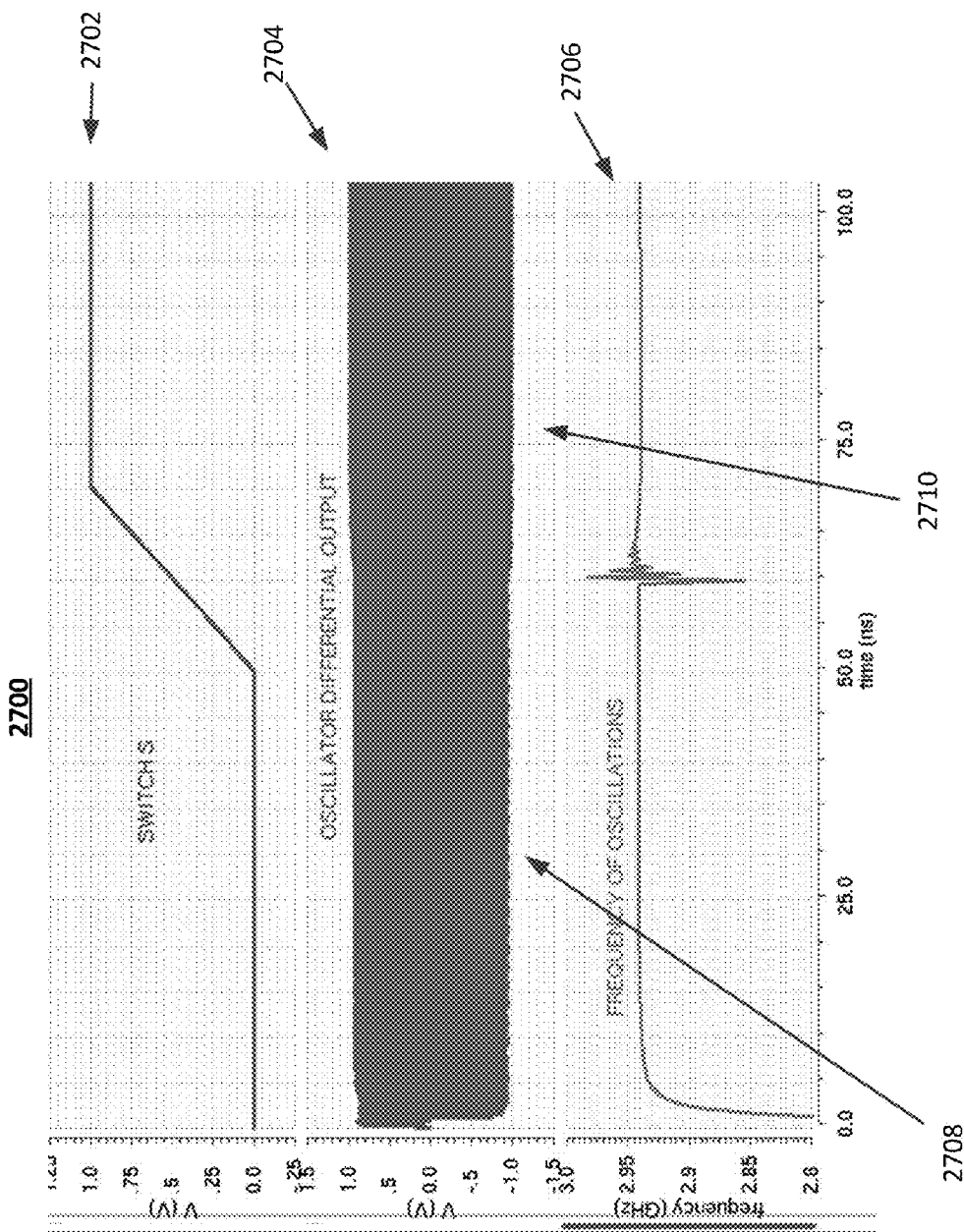
FIG. 27 shows a plot of differential output voltage and frequency over time for oscillations created by the oscillator of FIG. 26 in accordance with an embodiment of the present disclosure.

FIG. 27 shows plots 2700 of oscillations created by the oscillator 2600 of FIG. 26 in accordance with an embodiment of the present disclosure. The y-axis of graph 2702 shows the voltage at the control input to the first switch 2616 S1 which is the inverse of the voltage at the control input of the second switch S2 2618. A low voltage level (0V) 2702 refers to injection mode, and a high voltage level (1V) 2702 refers to non-injection resonator mode. The y-axis of graph 2704 shows the differential output voltage of the oscillator 2600. The y-axis of graph 2706 shows the frequency of oscillations in the oscillator 2600. The x-axis for all of the graphs 2702, 2704, 2706 show the time in nanoseconds (ns). Both the frequency and the differential output voltage of the oscillations differ slightly between injection mode 2708 and resonator mode 2710. Notwithstanding, once oscillations reach a steady state at a frequency close to the resonator mode frequency and the clock source 2614 is disconnected, the oscillation frequency will automatically adjust to the correct resonator mode of oscillations without entering a parasitic mode such as high-frequency package mode oscillations. In other words, the oscillations injected by the clock source 2614 need not be at the exact frequency of the resonator mode and may vary by several percent, so long as the frequency is not close to the parasitic-mode frequencies.

In the preceding description, for purposes of explanation, numerous details are set forth in order to provide a thorough understanding of the embodiments of the disclosure. However, it will be apparent to one skilled in the art that these specific details are not required. In other instances, well-known electrical structures and circuits are shown in block diagram form.

The above-described embodiments are intended to be examples only. Alterations, modifications, and variations may be effected to the particular embodiments by those of skill in the art without departing from the scope, which is defined solely by the claims appended hereto.

What is claimed is:

1. An oscillator, comprising:
   a resonator input configured to receive, from an electro-mechanical resonator, a resonator signal;
   an oscillator core comprising a first and a second cross-coupled complementary inverter forming a first loop and a second loop with the resonator input, respectively;
   wherein the inverters are programmable to contribute to the resonator signal a first gain or a second gain to generate balanced oscillations in the oscillator;
   wherein the first gain is less than an upper threshold gain required to generate parasitic-mode oscillations when starting balanced oscillations, and the second gain is equal to or greater than a lower threshold gain required to generate resonator-mode oscillations; and
   wherein each inverter comprises a first complementary transistor pair and a second complementary transistor pair, the first complementary transistor pair connected to the oscillator core to contribute gain to the resonator signal, the second complementary transistor pair in series with the first complementary transistor pair to regulate the amount of power received to control the gain contributed by the first complementary transistor pair according to a control voltage signal.

2. The oscillator of claim 1, further comprising an inverter controller connected to the inverters, the inverter controller configured to program the inverters to contribute the first gain when starting the balanced oscillations.

3. The oscillator of claim 2, wherein the inverters are programmable to contribute to the resonator signal a third gain between the first gain and the second gain.

4. The oscillator of claim 3, wherein the inverter controller is configured to increase the third gain contributed by the inverters by an amount less than the difference between the upper threshold gain required to generate parasitic-mode oscillations and the lower threshold gain required to generate resonator-mode oscillations.

5. The oscillator of claim 1, wherein each of the first gain and the second gain are less than the maximum amount of gain collectively contributable by all of the inverters.

6. The oscillator of claim 1, wherein the first gain is equal to or greater than the lower threshold gain required to generate resonator-mode oscillations.

7. The oscillator of claim 1, wherein second gain is equal to or less than an optimum power dissipation upper threshold gain amount.

8. The oscillator of claim 2, wherein the first and second inverters comprise a first bank of inverters and a second bank of inverters, respectively.

9. The oscillator of claim 8, wherein the inverter controller is configured to enable a first set of inverters in the banks of inverters and disable a second set of inverters in the banks of inverters to program the inverters.

10. The oscillator of claim 1, wherein the inverter controller comprises a digital counter connected to a digital-to-analog converter configured to output the control voltage signal.

11. The oscillator of claim 1, further comprising a process monitor unit configured to detect manufacturing process corner parameters of the inverters, wherein the first gain and the second gain of the inverters are programmed based on the detected manufacturing process corner parameters.

12. The oscillator of claim 1, further comprising an electro-mechanical resonator connected to the resonator input, the electro-mechanical resonator comprising a thin-film bulk acoustic resonator, a bulk acoustic wave resonator, a surface acoustic wave resonator, a micro-electro-mechanical system resonator, or a quartz crystal resonator.

13. The oscillator of claim 1, wherein the oscillator comprises a first and a second capacitor connected in series in the first and second loops to outputs of the first and second cross-coupled complementary inverters, respectively, the capacitors for inhibiting the cross-coupled complementary inverters from latching to a non-oscillatory direct-current stable state when starting balanced oscillations; and the oscillator comprises a resistor connected to the capacitors and to the inverters for creating a high-pass filter with the capacitors to inhibit relaxation-mode oscillations.

14. An oscillator for generating balanced oscillations, the oscillator comprising:
    a resonator input configured to receive, from an electro-mechanical resonator, a resonator signal for creating oscillations in the oscillator;
    an oscillator core connected to the resonator input, the oscillator core for starting and sustaining balanced oscillations in the oscillator, the oscillator core comprising
    first and second cross-coupled complementary programmable inverters forming a first loop and a second loop with the resonator input, respectively, the inverters programmable to contribute a first gain to the balanced oscillations, and contribute a second gain, greater than or equal to the first gain, to the balanced oscillations, wherein the first gain is less than an upper threshold gain required to generate parasitic-mode oscillations when starting balanced oscillations, and the second gain is equal to or greater than a lower threshold gain required to generate resonator-mode oscillations;
    first and second capacitors connected in series in the first and second loops to outputs of the first and second cross-coupled complementary inverters, respectively, the capacitors for inhibiting the cross-coupled complementary inverters from latching to a non-oscillatory direct-current stable state when starting balanced oscillations; and
    a resistor network connected to the capacitors and to the inverters for creating a high pass filter with the capacitors to inhibit relaxation-mode oscillations;
    wherein each inverter comprises a first complementary transistor pair and a second complementary transistor pair, the first complementary transistor pair connected to the oscillator core to contribute gain to the resonator signal, the second complementary transistor pair in series with the first complementary transistor pair to regulate the amount of power received to control the gain contributed by the first complementary transistor pair according to a control voltage signal.

15. A method for generating balanced oscillations in an oscillator, the method comprising:
    starting balanced oscillations in the oscillator using an electro-mechanical resonator and an oscillator core;
    inhibiting the oscillator from latching to a non-oscillatory direct-current stable state using a capacitance in the oscillator core;

inhibiting relaxation mode oscillations in the oscillator using a high-pass filter;

contributing a gain to the balanced oscillations using the oscillator core, the gain less than an upper threshold gain required to generate parasitic-mode oscillations and greater than a lower threshold gain required to generate resonator-mode oscillations; and increasing the gain contributed by the oscillator core to the oscillations in increments over a period of time, each increment sufficiently small to avoid parasitic mode oscillations.

16. The method of claim 15, further comprising detecting a manufacturing process corner parameter of the oscillator core, and selecting the gain in response to the detected process corner parameter.

17. The method of claim 15, further comprising detecting a manufacturing process corner parameter of the oscillator core, and increasing the gain in response to the detected process corner parameter so that the gain is less than an optimum power dissipation upper threshold.

18. The method of claim 15, wherein the gain is contributed by complementary cross-coupled programmable inverters, each inverter comprising a first complementary transistor pair and a second complementary transistor pair, the first complementary transistor pair connected to the oscillator core to contribute gain to the balanced oscillations, the second complementary transistor pair in series with the first complementary transistor pair to regulate the amount of power received to control the gain contributed by the first complementary transistor pair according to a control voltage signal.

19. The method of claim 18, further comprising counting the number of balanced oscillations in the period of time, and varying the voltage signal according to the number of balanced oscillations.

20. The method of claim 15, wherein every 0.1 milliseconds the gain is increased by an increment of no more than 20 percent of the maximum gain contributable by the oscillator core.

* * * * *

UNITED STATES PATENT AND TRADEMARK OFFICE
CERTIFICATE OF CORRECTION

| | | |
|---|---|---|
| PATENT NO. | : 9,515,605 B1 | |
| APPLICATION NO. | : 14/835244 | |
| DATED | : December 6, 2016 | |
| INVENTOR(S) | : Srinivasa Rao Madala et al. | |

It is certified that error appears in the above-identified patent and that said Letters Patent is hereby corrected as shown below:

On the Title Page

On item (73) Assignee:

Please delete: "Microsemi Storage Solutions (U.S.), Inc., Aliso Veijo, CA (US)"

Please insert: --Maxlinear Asia Singapore PTE LTD, Singapore (SG)--

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*